United States Patent
Tanaka et al.

(10) Patent No.: US 6,422,172 B1
(45) Date of Patent: Jul. 23, 2002

(54) PLASMA PROCESSING APPARATUS AND PLASMA PROCESSING METHOD

(75) Inventors: Jyunichi Tanaka, Chiyoda-machi; Toru Otsubo, Fujisawa; Toshio Masuda, Toride; Ichiro Sasaki, Yokohama; Tetsunori Kaji, Tokuyama; Katsuya Watanabe, Kudamatsu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/040,404

(22) Filed: Mar. 18, 1998

(30) Foreign Application Priority Data

Mar. 19, 1997 (JP) .............................................. 9-066095

(51) Int. Cl.$^7$ ................................................. C23F 1/02
(52) U.S. Cl. ................................ 118/723 R; 118/723 I; 118/723 E; 204/298.34; 204/298.37; 204/298.38
(58) Field of Search ..................... 118/723 MA, 723 R, 118/723 IR, 723 ER, 723 E, 723 I; 156/345; 204/298.34, 298.37, 298.16, 298.02, 298.38

(56) References Cited

U.S. PATENT DOCUMENTS

| | | | |
|---|---|---|---|
| 5,513,765 A | * | 5/1996 | Usui |
| 5,554,223 A | * | 9/1996 | Imahashi |
| 5,556,501 A | * | 9/1996 | Collins et al. |
| 5,587,205 A | * | 12/1996 | Saito et al. |
| 5,824,607 A | * | 10/1998 | Trow et al. |
| 5,874,012 A | * | 2/1999 | Kanai et al. |

FOREIGN PATENT DOCUMENTS

| | | | |
|---|---|---|---|
| JP | 402050960 A | * | 2/1990 |
| JP | 406041739 A | * | 2/1994 |
| JP | 410152784 A | * | 6/1998 |

* cited by examiner

Primary Examiner—Deborah Jones
Assistant Examiner—Jennifer McNeil
(74) Attorney, Agent, or Firm—Antonelli, Terry, Stout & Kraus, LLP

(57) ABSTRACT

A plasma processing apparatus has plasma generating means including a means for generating capacitive coupled discharge and a means for radiating electromagnetic waves, so that the energy state of electrons is independently controlled by a combination of a plasma due to capacitive coupled discharge and a plasma due to radiation of electromagnetic waves of a high-frequency, to thereby control the occurrence of radical species, and thereby establishing a compatibility, for example, between high selective etching and high accuracy and high speed in etching or between film quality and film formation rate. Since the density distribution of the plasma can be controlled without any change in hardware configuration by adjusting distributions of the power for capacitive coupled discharge and the power for radiation of electromagnetic waves, the entire surface of a large-sized substrate can be etched at a high accuracy into a fine pattern. The apparatus is also intended to prevent the occurrence of dust caused by plasma processing and changes in characteristics of plasma processing, and hence to enhance productivity of semiconductor devices and/or liquid crystal display elements.

11 Claims, 16 Drawing Sheets

PLASMA PROCESSING APPARATUS AND PLASMA PROCESSING METHOD

BACKGROUND OF THE INVENTION

The present invention relates to a processing apparatus including a plasma generating means, and particularly to a plasma processing apparatus which is used for plasma etching of a type suitable for forming fine patterns on semiconductor devices or liquid crystal display elements and also suitable for uniformly processing large-diameter substrates, and which is used for plasma CVD and plasma polymerization suitable for forming thin films with fine structures; and the invention relates to a plasma processing method using the plasma processing apparatus.

In a plasma processing apparatus for processing semiconductor elements or liquid crystal display elements using a plasma, it is necessary to control the radical species and the energy of ions to be incident on a substrate to be processed, the directivity of ions, and the uniformity of plasma processing exerting an effect on the processing capability, and also to enhance the productivity of plasma processing.

With respect to the control of radical species, a parallel plate electrode type plasma processing apparatus has been disclosed, for example, in Japanese Patent Laid-open No. Sho 57-131374, and an example of this parallel plate electrode type plasma processing apparatus is shown in FIG. 17.

In the apparatus shown in FIG. 17, a processing chamber 9 surrounded by a cylindrical side wall portion 6, an insulating portion 5, and a disk-like electrode 2 is kept in a vacuum by an evacuating means (not shown). A processing gas is supplied from a gas supplying means 7 into the processing chamber 9 through the electrode 2 serving as a gas introducing passage. In general, the side wall portion 6 is earthed, and is insulated from the electrode 2 by means of the insulating portion 5. The electrode 2 and a stage 3 constitute parallel plate electrodes. When power is applied from a power supply 1 between these parallel plate electrodes, a plasma of the processing gas is generated in the processing chamber 9.

A wafer 4 to be processed is placed on the stage 3 at a lower portion of the processing chamber 9 and is subjected to fine processing by plasma generated in the processing chamber 9 and radical species in the processing gas activated by the plasma. At this time, the plasma density and the temperature of electrons in the plasma are changed, and, at the same time the decomposition state of the processing gas, that is, the amount and the ratio of the radical species exerting an effect on the fine processing capability are changed, depending on the power inputted from the power supply 1, the pressure in the processing chamber 9, the width of the gap between the electrode 2 and the stage 3, and the like.

With respect to control of the energy of the ions, there is a method disclosed in Japanese Patent Laid-open No. Hei 4-239128.

In this method, a divergent magnetic field is provided in such a manner as to be directed perpendicularly to parallel plate electrodes, whereby a self-bias voltage is controlled independently of the output from a high-frequency power supply for generating plasma, so as to independently control the energy of ions to be incident on a substrate by the magnetic field, thereby performing etching at a high accuracy with no damage.

As a method of enhancing the directivity of ions without a reduction in processing rate, there is a method disclosed in Japanese Patent Laid-open No. Hei 8195379.

This method is intended to realize plasma processing capable of generating a high density plasma at a low pressure and of enhancing the controllability of the plasma density distribution by generating a capacitive coupled plasma mixed with an inductive coupled plasma.

As a plasma processing apparatus for controlling the uniformity of plasma processing, there is an apparatus disclosed in Japanese Patent Laid-open No. Sho 61-283127.

In this apparatus, an electrode to which a high-frequency power is applied is divided into a plurality of parts, wherein the power applied to each of the divided electrode parts is independently controlled, to thereby improve the uniformity of plasma processing.

A large problem occurring in the case of enhancing the productivity of plasma processing is that a film, formed on an inner wall surface of a processing chamber during etching or plasma CVD, peels or flakes to give rise to dust, and the dust acts to reduce a rate of production of non-defective products to the total products being produced, such as highly integrated semiconductor devices and liquid crystal display elements, that is, to reduce the production yield. Another problem is that in the course of production, processing characteristics are changed, which also reduces the production yield.

The occurrence of dust will be more fully described below. A deposition film formed on an inner wall surface of a processing chamber by plasma processing is subjected to repeated temperature changes due to variations in heat inputted from the plasma, with a result that a stress occurs in the deposition film. Then, when the film is made thicker, the stress in the film becomes larger than the adhesive force of the film, causing peeling of the film, leading to the occurrence of dust.

A plasma processing apparatus which is intended to remove a deposition film formed on an inner wall surface of a processing chamber is disclosed in Japanese Patent Laid-open No. Hei 8-330282. In this apparatus, the removing rate of a deposition film is enhanced by increasing the energy of ions incident on a surface on which a deposition film is formed.

Further, a method of converting a deposition film formed on an inner wall surface of a processing chamber into a volatile material and exhausting such a material using an evacuating system is disclosed in Japanese Patent Laid-open No. Hei 7-153751. In this method, a non-gaseous material disposed in a processing chamber reacts with the plasma to create reactive chemical species, which in turn react with a deposition film to convert the deposition film into a volatile material, followed by cleaning of the volatile material.

To stabilize the processing characteristics of plasma processing, Japanese Patent Laid-open Nos. Hei 6-188220 and Sho 61-8927 disclose a method of controlling the temperature of an inner wall surface of a plasma processing chamber at a specific value and an apparatus provided with parallel electrodes cooled by a fluid.

SUMMARY OF THE INVENTION

With a tendency toward higher integration of semiconductor devices and substrates of larger diameter for producing semiconductor devices, it is further required to attain high selectivity with respect to underlying materials, high accuracies in the processing of shapes, uniform processing of large-sized substrates, and reduction in the occurrence of dust.

1) One factor exerting a large effect on processing characteristics, such as a selectivity, the processing shape and the film quality in plasma etching and plasma CVD, is based on radical species produced by collision of electrons in the plasma. The generation amount and the kinds of radical species are dependent on the energy state of electrons in the plasma.

The energy state of electrons in the plasma is determined on the basis of the collision frequency of electrons depending on the processing pressure, the disappearance rate of electrons due to diffusion of electrons in the plasma, and the like. The energy state of electrons in plasma is expressed by a statistical distribution based on the collision of the electrons with neutral molecules, ions and the like. It has been considered difficult to control such a statistical distribution of the energy state of electrons, except that the statistical distribution can be changed by varying the collision frequency of electrons through control of the processing pressure. For this reason, to control the energy state of electrons, there has been adopted a method of controlling the processing pressure. Such a method of controlling the processing pressure, however, has a problem. That is, in the case of etching, it is difficult to ensure a compatibility between a fine-processing capability and a high selectivity; and, in the case of plasma CVD, it is difficult to ensure a compatibility among the film formation rate, the film quality and the coverage of the device surface.

An object of the present invention is to provide a plasma processing apparatus which is capable of controlling the components and the amount of radical species, not by the conventional manner using process conditions, such as processing pressure, but by providing a means for controlling the energy of electrons in the plasma independently from the plasma generating means and the ion energy controlling means, thereby attaining fine processing with a high selectivity.

2) With respect to the uniformity of plasma processing, it is necessary to ensure a compatibility between control of the radical species, control of the energy of the ions, and the occurrence of a high density plasma at a low pressure.

Further, with a tendency toward larger diameter substrates to be processed, the processing gas flows from a central portion to an outer peripheral portion of a substrate upon etching or plasma CVD. Consequently, both the concentration distribution of the radical species and the thickness distribution of the deposition film come to be actualized. This makes it difficult to uniformly process the entire surface of a large-sized substrate. To solve this problem, it is required to cancel a factor which is impossible in uniform distribution with another control factor relating to the etching characteristics. Such a control factor is required to make it possible to adjust an irregular distribution of plasma for each process condition, independently from other processing conditions, such as the plasma density and the processing pressure.

Another object of the present invention is to provide a plasma processing apparatus having a uniformity controlling mechanism capable of controlling the uniformity of plasma in a state which is compatible with control of the radical species, control of the energy of the ions and the occurrence of a high density plasma at a low pressure, and also which is independent from other processing conditions; and to provide a plasma processing method using the plasma processing apparatus.

3) As described above, to reduce the occurrence of dust, there have been proposed various methods for removing a deposition film which has formed on an inner surface of a processing chamber. Of these methods, however, the method for vaporizing a deposition film and exhausting the vaporized film has a problem in that it takes a lot of time to vaporize the deposition film, resulting in the degraded productivity. Further, a wall surface from which a deposition film is removed is deteriorated because such a wall surface is exposed to radical species and ions in the plasma. As a result, the reaction on the wall surface is changed, to thereby affect the plasma processing characteristics.

Further, an inner wall surface of a processing chamber includes various surface portions which have a different processing state, such as a surface portion to which a high-frequency power is applied and a surface portion which is grounded, and accordingly, reduction in dust must be performed in consideration of these different surface states.

A further object of the present invention is to provide a plasma processing apparatus which is capable of being operated at a specific level of productivity for a long period of time without the occurrence of dust.

To achieve the above object, the present invention provides the following means:

1) A means for generating plasma by capacitive coupled discharge and a means for radiating electromagnetic waves in the plasma are provided, whereby an energy is given from the electromagnetic waves to electrons in the plasma generated by capacitive coupled discharge, to control the energy and the density of electrons, thus adjusting the composition and the amount of radical species.

To be more specific, parallel plate electrodes, an antenna for radiating electromagnetic waves, and a magnetic field allowing the electromagnetic waves radiated by the antenna to pass through the plasma may be provided in a processing chamber, wherein a plasma generating region of the antenna is disposed in such a manner as to be superimposed on a plasma generating region of the parallel plate electrodes, whereby the energy and the density of electrons are controlled by a combination of the plasma generated by the parallel plate electrodes and the plasma due to electromagnetic waves inputted from the antenna.

With this configuration, since the energy of electrons can be controlled by radiation of electromagnetic waves from the antenna, the energy state of electrons in the plasma can be changed by varying the ratio between the power supplied to the parallel plate electrodes for capacitive coupled discharge and the power supplied to the antenna for radiation of electromagnetic waves, to thereby control the amount and the kinds of the radical species.

The intensity of the above magnetic field is also set to be variable with respect to the frequency of electromagnetic waves radiated from the antenna in a range including a value at which electron cyclotron resonance occurs. Accordingly, the energy level given to electrons in plasma can be controlled by varying the intensity of the magnetic field.

2) With respect to control of the uniformity of the plasma, two or more of antennas for radiating electromagnetic waves in the plasma are provided, wherein the plasma distribution is controlled by a means for controlling the electromagnetic waves radiated from each of the antennas.

The fact that the density of electrons can be controlled by radiating electromagnetic waves in the plasma is as described above regarding the radical species generating means.

As an antenna for radiating electromagnetic waves, an electrode for capacitive coupled discharge may be divided into a plurality of parts, and a high-frequency voltage may be generated between each of-adjacent groups of the divided electrode parts to radiate electromagnetic waves between each of the adjacent groups of the divided electrode parts.

By controlling a high-frequency voltage between each of the adjacent groups of the divided electrode parts, it is possible to control the power of the electromagnetic waves radiated between each of the adjacent groups of the divided electrode parts. To control the high-frequency voltage generated between each of the adjacent groups of the divided electrode parts, the phase of a high-frequency voltage applied to each of the divided electrode parts may be controlled.

3) In the case of an electrode to which a high-frequency is applied in a plasma processing chamber, ions are accelerated by a high-frequency electric field and are incident on the electrode. Accordingly, by removing a deposition film adhering on a surface of the electrode through the energy of the ions, dust caused by the deposition film can be reduced.

A surface portion of an electrode may be made from a material which will not react with radical species generated by plasma processing and not produce a nonvolatile material. Further, contact between an electrode and a surface portion of an electrode may be made high to enhance thermal transfer from a surface portion of an electrode to a cooled electrode and to reduce a temperature rise. With this configuration, it is possible to reduce the occurrence of dust due to formation of a non-volatile reaction product on the surface of the electrode, and to stabilize the reaction on the surface of the electrode by reducing the temperature rise and hence to prevent a variation in plasma processing characteristics.

With respect to other portions, the temperature of an inner wall surface of a processing chamber may be kept constant, to prevent the occurrence of stress in a film due to a variation in heat. This prevents occurrence of peeling of the film. Further, by maintaining the temperature on the inner wall surface, the reaction on the surface can be stabilized and thereby a variation in plasma processing characteristics can be prevented.

DESCRIPTION OF THE PREFERRED EMBODIMENTS

Figure 1:
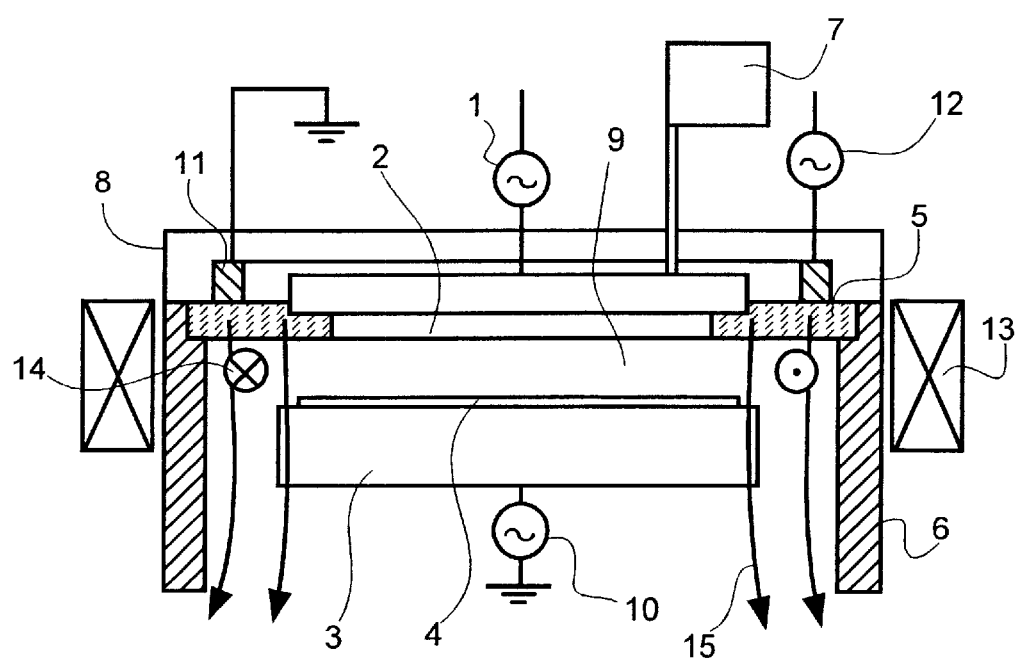
FIG. 1 is a side view showing the configuration of a plasma processing chamber representing a first embodiment of the present invention.

Hereinafter, embodiments of the present invention will be described with reference to FIGS. 1 to 16.

First, a first embodiment will be described with reference to FIG. 1.

A stage 3 for supporting an object to be processed is disposed in a processing chamber 9, and an object 4 to be processed is mounted on the stage 3. The object 4 to be processed is represented by a wafer for a semiconductor device. A portion of a wall of the processing chamber 9 is used as an electrode 2, which has a parallel plate electrode structure, in co-operation of the stage 3 serving as an electrode. Each of the stage 3 and the object 4 to be processed is usually formed into a flat shape. However, the electrode 2 may be formed not only into a flat shape as shown in FIG. 1, but also into a stepped shape as shown in FIG. 2A or a curved shape as shown in FIG. 2B. Even in the case where the electrode 2 is formed into one of the shapes shown in FIG. 1 and FIGS. 2A and 2B, the combination of the electrode 2 and the stage 3 is referred to as a parallel plate electrode arrangement hereinafter. In general, the electrode 2 is exposed to the atmosphere of the processing chamber 9; however, a cover made from an insulator may be disposed between the electrode 2 and the processing chamber 9. A processing gas is introduced into the processing chamber 9 through a gas supplying means 7, and, for example, as shown in FIG. 1, the electrode 2 often serves as a processing gas introducing passage.

The processing chamber 9 is evacuated by an evacuating means (not shown) and is kept in a reduced pressure state. The processing chamber 9 is surrounded by a grounded cylindrical side wall portion 6, and the electrode 2 is electrically insulated from the side wall portion 6 by means of an insulator 5. A power supply 1 is composed of a combination of an AC power supply and a matching circuit. When power is applied from the power supply 1 between the parallel plate electrodes, a plasma of the processing gas is generated in the processing chamber, and the processing gas is activated by the plasma to create various kinds of radical species. An antenna 11 is disposed in the vicinity of the insulator 5. The insulator 5 functions as a window for introducing electromagnetic waves generated by the antenna 11 into the processing chamber 9. The antenna 11 may be a loop antenna having one or a plurality of input terminals for the supply of power and one or a plurality of output terminals and is wound one or more turns, or it may be a division type loop antenna with one turn divided into a plurality of parts. Alternatively, the antenna 11 may be formed into a shape different from the above shape so long as it can radiate electromagnetic waves. In the example shown in FIG. 1, power is supplied from a power supply 12 to the antenna 11; however, power may be applied from the power supply 1 to both the electrode 2 and the antenna 11.

Figure 3:
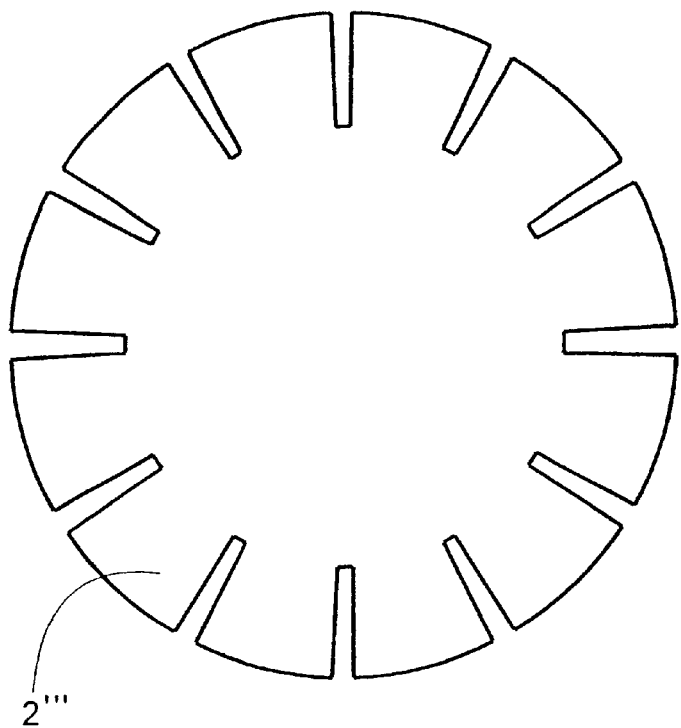
FIG. 3 is a plan view showing a further example of the electrode structure shown in the first embodiment.

To allow a current to flow from the antenna 11 to the electrode 2, the electrode 2 may be provided with an insulating region, such as slits, for inhibiting an induced current from flowing to the electrode 2, for example, as shown in FIG. 3, so as to easily introduce power from the antenna 11 into the processing chamber 9. The antenna 11 induces an electric field 14, shown in FIG. 1, into the processing chamber 9 to create a plasma. Since the antenna 11 creates a plasma in the vicinity of the side wall portion 6, the state of the wall surface of the side wall portion 6 can be controlled by adjusting the level of power supplied from the power supply 12.

Radical species excited by the plasma due to the antenna 11 are diffused and partially permeate in a space between the parallel plate electrodes; however, these radical species are different in composition from radical species excited by the plasma due to the parallel plate electrodes, as a result of which the composition of radical species in the processing chamber 9 can be controlled by adjusting the level of power supplied to the antenna.

Figure 2A:
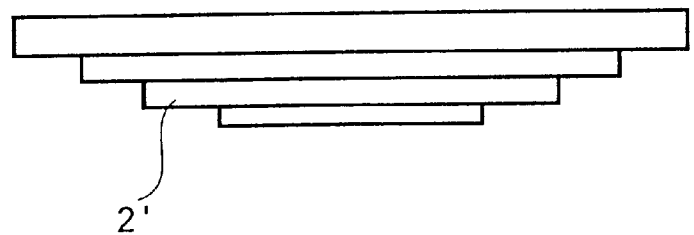
FIGS. 2A and 2B are side views showing other examples of the electrode structure shown in the first embodiment.
Figure 2B:

In the apparatus shown in FIG. 1, a magnetic field can be applied to the interior of the processing chamber 9 by a magnetic field generating means 13. For example, a magnetic field having a distribution indicated by the magnetic lines of force 15 in FIG. 1 can be generated using a cylindrical solenoid coil. When an oscillating electric field 14 generated by the antenna 11 is substantially perpendicular to the magnetic lines of force 15, it is possible to create a plasma with a high efficiency by matching the frequency of the electric field 14 with the intensity of the magnetic field 15 in such a manner as to create electron cyclotron resonance. For example, in the case where the oscillating electric field has a frequency of 68 MHz, electron cyclotron resonance occurs in the vicinity of the magnetic field intensity of 24 gauss.

Further, by adjusting the magnetic field intensity in a range near the value at which electron cyclotron resonance occurs, it is possible to adjust the composition of the radical species, and hence to optimize the fine-processing capability.

At a magnetic field intensity level which is stronger than the,value at which electron cyclotron resonance occurs, electromagnetic waves can be propagated in the plasma along the magnetic field. Accordingly, as shown in FIG. 1, the efficiency at which plasma is created can be enhanced by setting the position of the antenna and the distribution of the magnetic field such that magnetic lines of force penetrating the antenna pass through a location at which the plasma is to be created in the processing chamber.

A second embodiment of the invention will be described with reference to FIG. 4.

Figure 4:
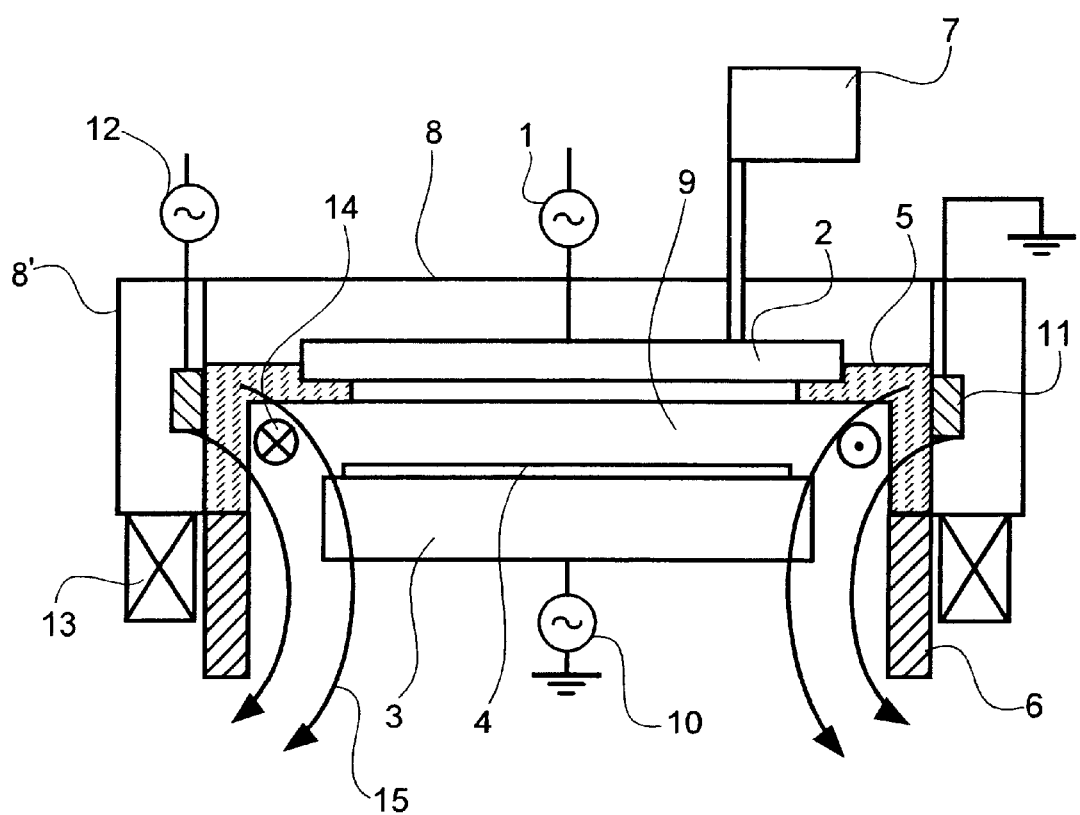
FIG. 4 is a side view showing the configuration of a plasma processing chamber representing a second embodiment of the present invention.

The apparatus shown in FIG. 4 is the same as that shown in FIG. 1, except that the antenna 11 disposed on the upper surface of the processing chamber 9 in FIG. 1 is disposed on a side surface of the processing chamber 9 in FIG. 4. In the apparatus shown in FIG. 4, to prevent leakage of electromagnetic waves generated by the antenna 11 to the exterior, the antenna 11 is surrounded by a conductive wall 8'. The conductive wall 8' may be integrated with a conductive wall 8. Another feature of the apparatus shown in FIG. 4 is that the magnetic field generating means 13 in the form of a solenoid coil is disposed lower than that shown in FIG. 1 to allow the magnetic lines of force 15 penetrating the antenna 11 disposed on the side surface of the processing chamber 9 to pass through the interior of the processing chamber 9. With this arrangement of the magnetic field generating means 13, as described in the embodiment shown in FIG. 1, when a magnetic field stronger than that at which electron cyclotron resonance occurs is applied, electromagnetic waves radiating from the antenna 11 will easily enter the plasma in the processing chamber 9, to thus increase the efficiency of creating the plasma.

A third embodiment will be described with reference to FIG. 5.

Figure 5:
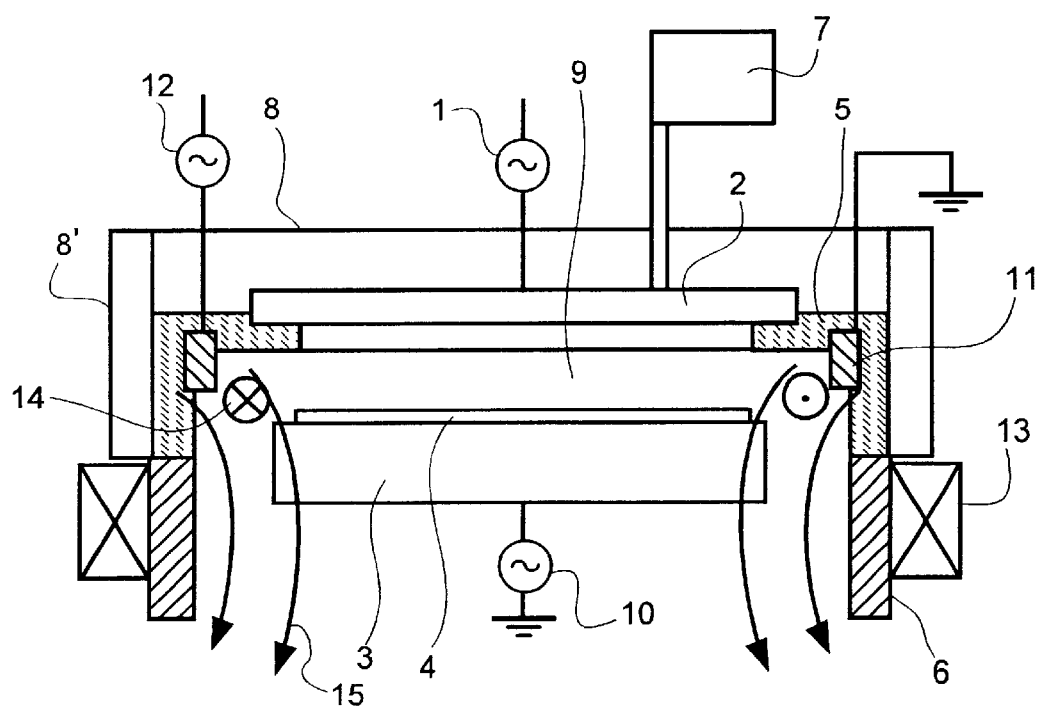
FIG. 5 is a side view showing the configuration of a plasma processing chamber representing a third embodiment of the present invention.

The apparatus shown in FIG. 5 is the same as that shown in FIG. 4, except that the antenna 11 is disposed in the processing chamber 9. If there is a fear that direct exposure of the antenna 11 to the plasma in the processing chamber 9 will etch the antenna 11 and produce an adverse effect on fine processing, it is preferable to coat the surface of the antenna 11 with a material which is resistant against the plasma or to mount a cover made from an insulator on the antenna 11. By disposing the antenna 11 in the processing chamber 9, as in this embodiment, it is possible to provide an antenna even when there is no space for provision of the antenna 11 on the upper or side surface of the processing chamber.

A fourth embodiment will be described with reference to FIG. 6.

Figure 6:
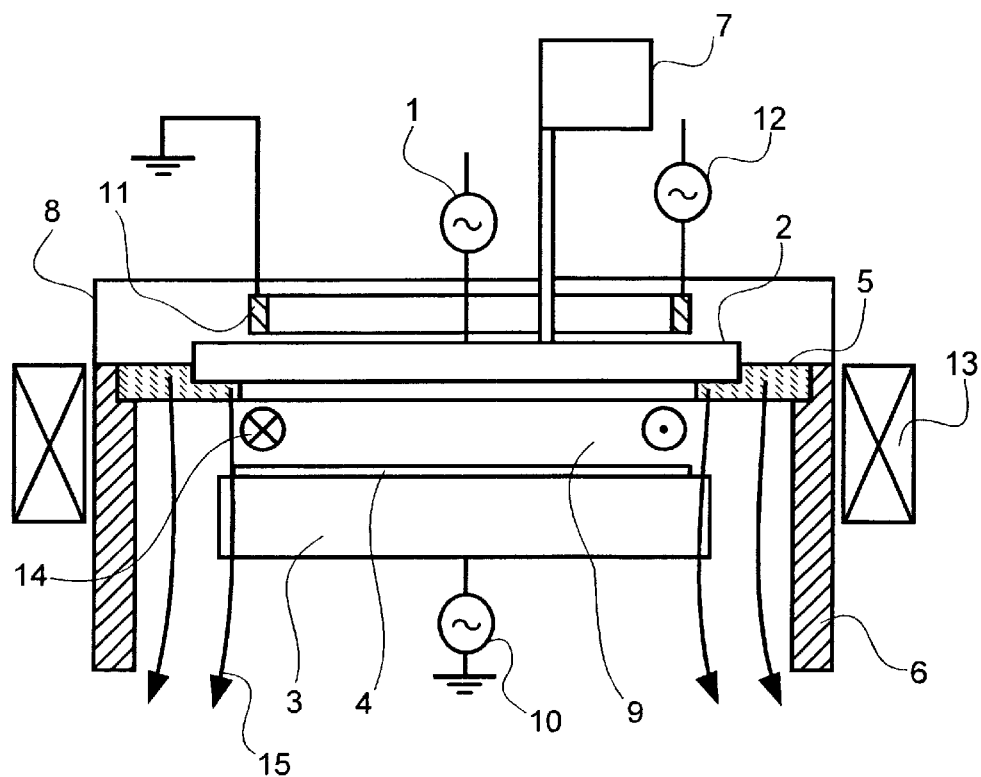
FIG. 6 is a side view showing the configuration of a plasma processing chamber representing a fourth embodiment of the present invention.

The apparatus shown in FIG. 6 is the same as that shown in FIG. 5, except that the antenna 11 is disposed on an upper portion of the electrode 2. In the case of the apparatus shown in FIG. 6, the electrode 2 has an insulating portion, such as the slits shown in FIG. 3, for allowing at least part of the electromagnetic waves induced by the antenna 11 to travel in the processing chamber 9 through the electrode 2, thereby creating a plasma or imparting an energy to the plasma. In this case, since plasma is created in a space between the electrode 2 and the stage 3 by both the parallel plate electrodes and the antenna, the fine-processing capability can be enhanced by adjusting the energy of the electrons in the plasma directly over an object to be processed by means of the power inputted into the antenna 11.

A fifth embodiment will be described with reference to FIG. 7.

Figure 7:
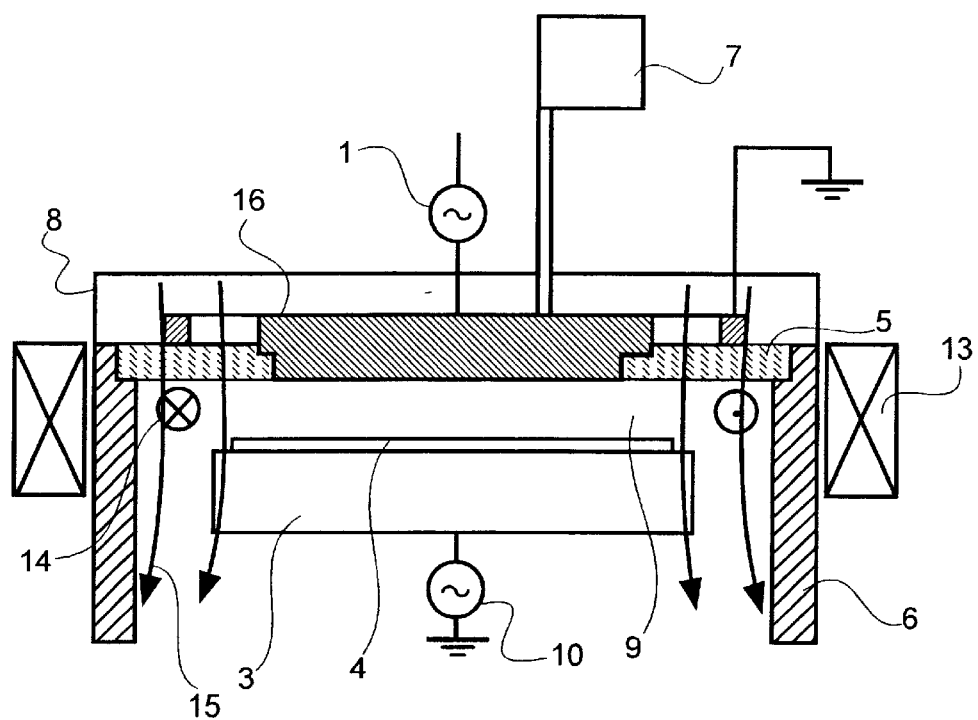
FIG. 7 is a side view showing the configuration of a plasma processing chamber representing a fifth embodiment of the present invention.

The apparatus shown in FIG. 7 is different from that shown in FIG. 1 in terms of use of an antenna electrode 16 in which the antenna 11 shown in FIG. 1 is integrated with the electrode 2.

Examples of such an antenna electrode are shown in FIGS. 9A to 9D. The antenna electrode is composed of one or a plurality of electrode portions 18, one or a plurality of antenna portions 19 connected to the electrode portions 18, and one or a plurality of input terminals 20 and one or a plurality of output terminals 21. In particular, in the antenna electrode shown in FIG. 9C, a slit-like insulating resin is provided to inhibit an induced current from being induced at the electrode portion 18 by electromagnetic waves radiated from the antenna portion 19, to increase the efficiency of radiation of the electromagnetic waves by the antenna portion 19.

Figure 9A:
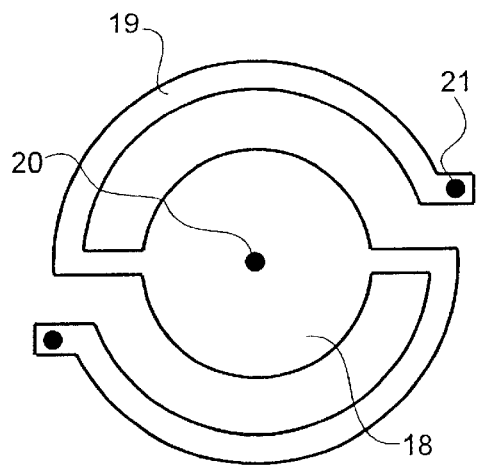
FIGS. 9A to 9D are plan views showing further examples of the antenna electrode structure shown in the fifth embodiment.
Figure 9B:
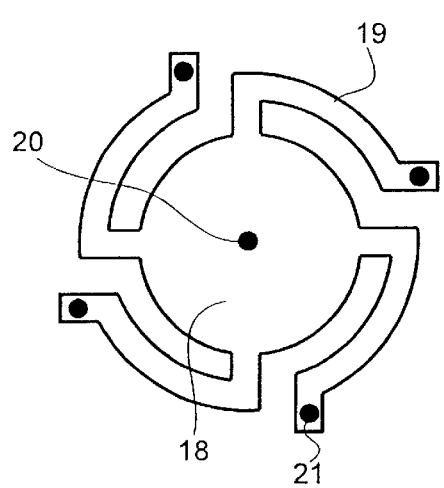
Figure 9C:
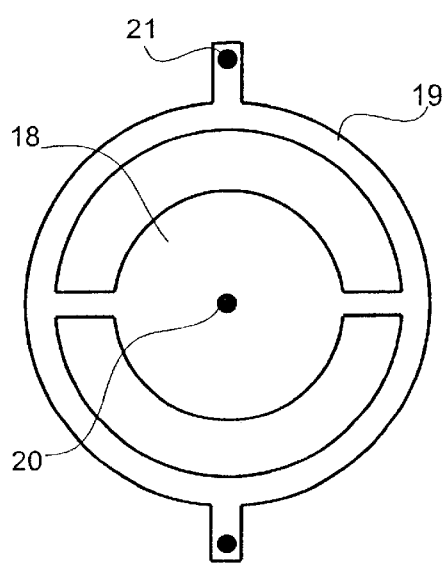
Figure 9D:
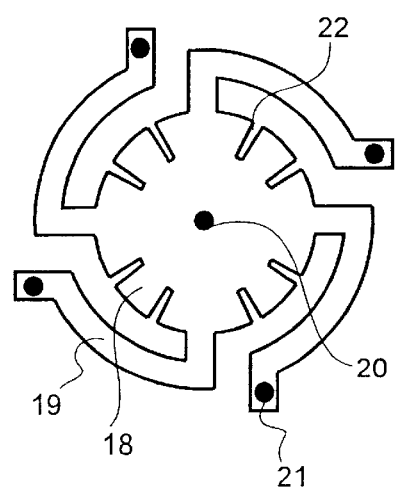

In the embodiment shown in FIGS. 7 and FIGS. 9A and 9D, the electrode portion 18 and the antenna portion 19 lie substantially on the same plane; however, the electrode portion 18 and the antenna portion 19 may be three-dimensionally arranged. For example, an antenna electrode may be provided in which the antenna portion 18 is disposed directly over the electrode portion 19. A portion of power supplied from the input terminal 20 from the power supply 1 is used to create plasma by the parallel plate electrodes, that is, the electrode portion 18 and the stage 3, and the remaining power is used to radiate electromagnetic waves from the antenna portion 19 to create plasma in the processing chamber 9. The output terminal 21 may be grounded, or may be connected to ground through a voltage holding means composed of a capacitor or the like for holding a voltage of the electrode portion 18 of the antenna electrode.

Further, the input terminal and the output terminal may be replaced with each other. By use of such an antenna electrode, it is possible to reduce the number of the power supplies which need to be provided for the electrode and the antenna into one power supply. In the embodiment shown in FIG. 7, the electrode portion of the antenna electrode is exposed in the processing chamber 9 and the antenna portion is disposed outside the processing chamber. In this case, as described above, a cover made from an insulator may be mounted on the electrode portion.

Figure 8:
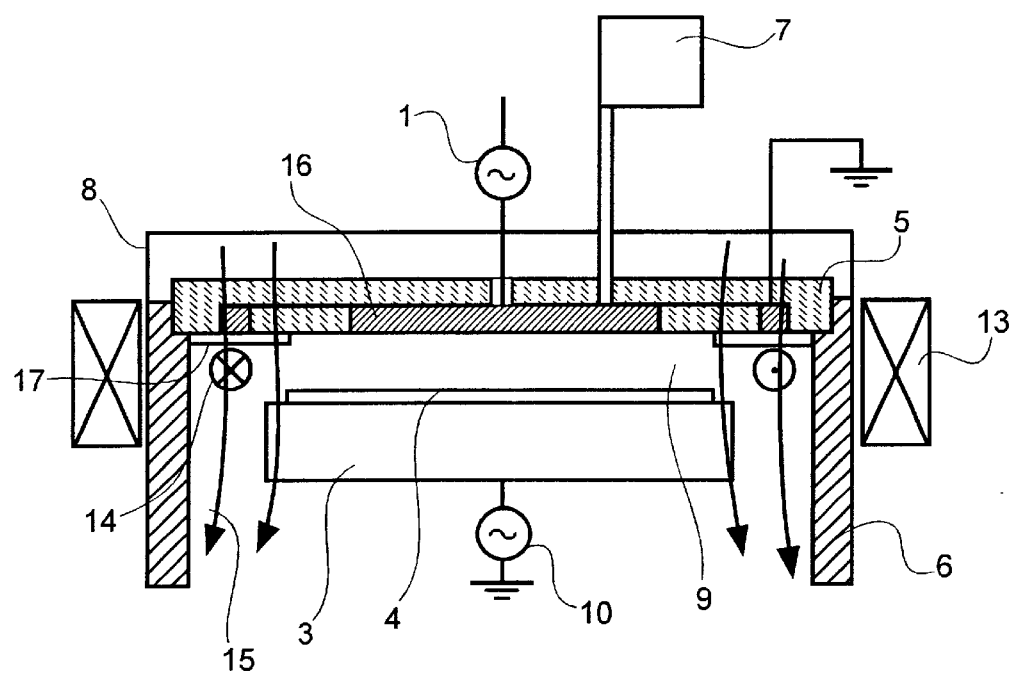
FIG. 8 is a side view showing another example of the electrode structure shown in the fifth embodiment.

Further, the antenna portion may be disposed in the processing chamber as shown in FIG. 8. In this case, a cover made from an insulator may be mounted on the antenna portion. The apparatus shown in FIGS. 7 and 8 has an effect which is substantially the same as that of the apparatus shown in FIG. 1, and can increase the capability of fine-processing for an object to be processed.

A sixth embodiment will be described with reference to FIG. 10.

Figure 10:
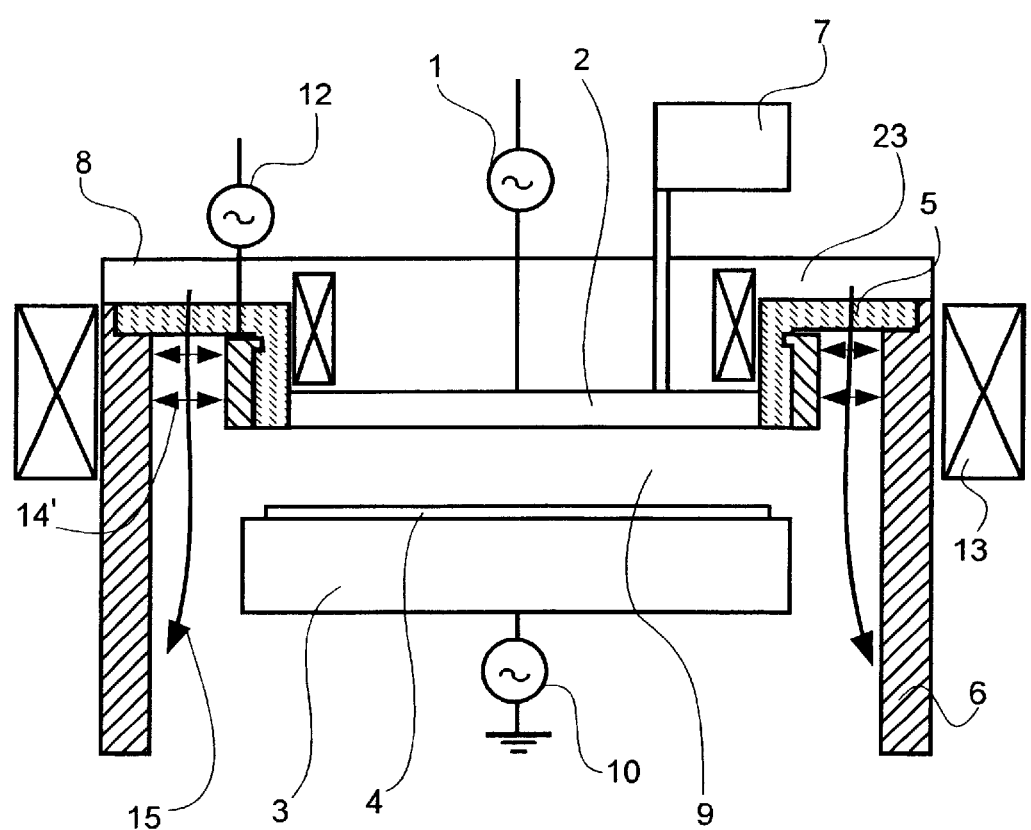
FIG. 10 is a side view showing the configuration of a plasma processing chamber representing a sixth embodiment of the present invention.

In the apparatus shown in FIG. 10, a power supply 12 for applying power between an outer peripheral electrode 23 and a side wall portion 6 is provided for creating plasma in the vicinity of the side wall portion 6 in the processing chamber. The plasma created by the outer peripheral electrode 23 can control the state of the wall surface of the side wall portion because the plasma is present near the side wall portion, to thereby increase the fine-processing capability. Further, by making the frequency of the power supply 1 different from that of the power supply 12, it is possible to create two kinds of plasma which are different in electron temperature, and hence to optimize the fine-processing capability by adjusting the composition of radical species, similar to the apparatus shown in FIG. 1. The magnetic field generating means 13 may be disposed such that the direction of an electric field 14 generated by the outer peripheral electrode 23 is substantially perpendicular to the magnetic lines of force 15. In this case, by setting the magnetic field intensity at a value at which electron cyclotron resonance occurs in the vicinity of the outer peripheral electrode 23, it is possible to increase the efficiency of creating plasma by the outer peripheral electrode 23.

A seventh embodiment will be described with reference to FIGS. 11(*a*) and 11(*b*).

Figure 11A:
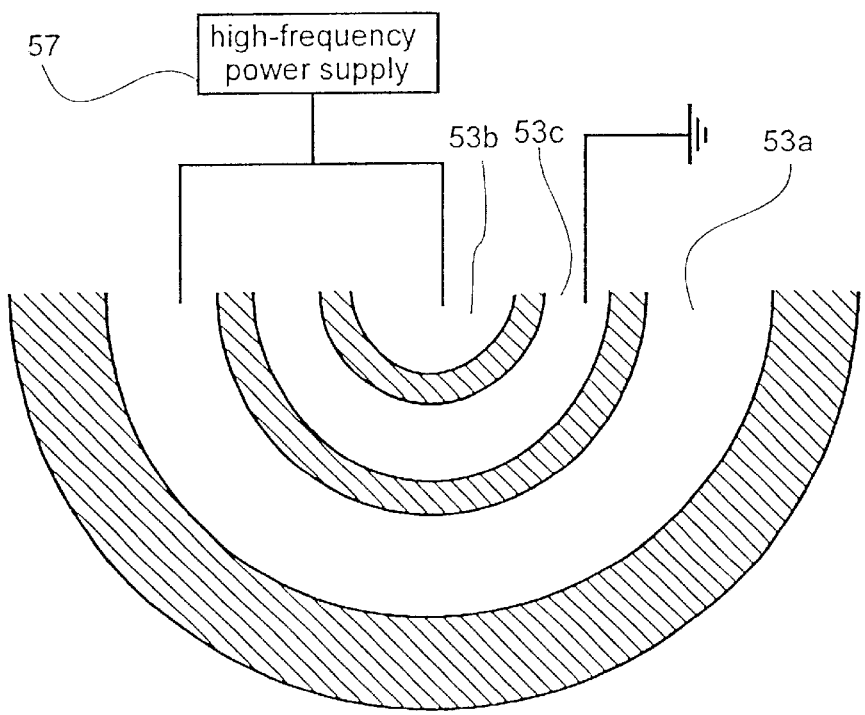
FIGS. 11(a) and 11(b) are top and side diagrammatic views, respectively, showing an electrode structure for a seventh embodiment of the present invention.
Figure 11B:
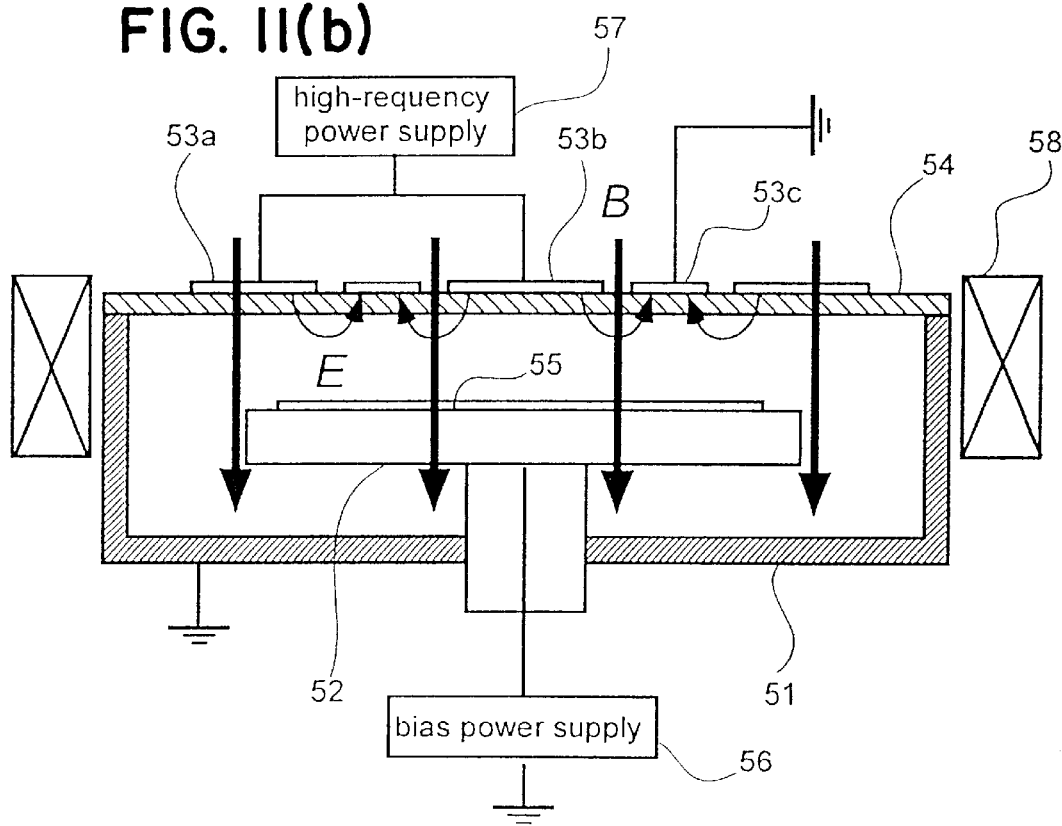

A stage electrode 52 and an upper electrode 53 are provided in a processing chamber 51 in such a manner as to be opposed to each other, as seen in FIG. 11(*b*). A main body of the processing chamber 51 is formed of a grounded metal vessel, and a quartz plate 54 covers an upper portion of the metal vessel. Joints between the processing chamber 51 and the quartz plate 54 and the electrodes are vacuum-sealed so that the interior of the processing chamber 51 can be evacuated in a vacuum. The processing chamber 51 has a processing gas supplying mechanism (not shown), so that the pressure in the processing chamber 51 can be controlled to a specific value by an evacuation control mechanism (not shown) while the processing gas is supplied into the processing chamber 51. The stage electrode 52 has a structure for allowing a substrate 55 to be processed to be mounted thereon. The temperature of the substrate 55 during plasma processing can be controlled by a temperature control mechanism (not shown). The stage electrode 52 is also connected to a bias power supply (2 MHz) 56 for controlling the energy of ions to be incident on the substrate 55.

The upper electrode 53 is composed of high-frequency applying ring electrodes 53*a* and 53*b*, and an grounded ring electrode 53*c*, as seen in FIG. 11(*a*). The high-frequency ring electrodes 53*a* and 53*b* are connected to a high-frequency power supply (100 MHz) 57, and the ring electrode 53c is grounded.

A coil 58 is provided around an outer periphery of the processing chamber 51 for forming a magnetic field in the processing chamber 51.

Next, an operational example in which etching is performed using the apparatus of this embodiment will be described.

First, the substrate 55 is carried and placed on the stage electrode 52. An etching gas (carbon fluoride based gas) at a specific flow rate is supplied from an etching gas source into the processing chamber, and the processing chamber is evacuated, such that the pressure in the processing chamber becomes 1 Pa. On the substrate 55 are formed a silicon oxide film as an insulating film and a silicon film for a semiconductor device. The substrate 55 is electrostatically chucked on the stage electrode 52, and He gas is supplied from a helium gas source (not shown) between the substrate 55 and the stage electrode 52 to prevent a temperature rise of the substrate 55 during etching.

A high-frequency power (100 MHz) of 1.5 RW is applied to the high-frequency applying ring electrodes 53*a* and 53*b* constituting the upper electrode, to generate plasma by discharge. Since the high-frequency applying ring electrodes 53*a* and 53*b* are insulated from the vacuum atmosphere in the processing chamber by means of the quartz plate 54, the supply of energy for creating a plasma is performed by capacitive coupling. In this case, since an electric field formed at an interface between a sheath and the plasma is small, the energy distribution of the electrons is close to a Maxwell-Boltzmann distribution.

A high-frequency electric field E is formed between each of the high-frequency ring electrodes 53*a* and 53*b* and the grounded ring electrode 53*c*, and electromagnetic waves are radiated from the electric field E in such a manner that a magnetic field is formed and then an electric field is further formed. Since the plasma density reaches the order of $10^{10}/cm^3$ due to capacitive coupled discharge, the electromagnetic waves thus radiated cannot proceed in the plasma; however, since an electric field is generated in the vicinity of the quartz plate 54, electrons are directly accelerated by such an electric field and thus receive energy. In this case, the electrons which are capable of receiving energy are only those in the vicinity of the quartz plate 54, and thereby the ratio of the energized electrons to the total electrons is small; however, the energy level of the electrons in general becomes higher than that in the plasma generated by capacitive coupled discharge.

In this way, according to this embodiment, energy is supplied to the plasma by two routes, i.e. due to capacitive coupling and direct heating by the high-frequency electric field. The energy level given to electrons through one route is different from that through the other route. Accordingly, the energy state of the electrons can be changed by varying the power in each route. As a method of changing the energy level of the electrons, there may be considered a method of changing the thickness of the quartz plate 54 and a method of changing the gap or spacing between the high-frequency ring electrode and the ground ring electrode. When the thickness of the quartz plate is made thick, the impedance of the capacitive coupling becomes higher, to make increase the discharge voltage. This increases the rate of radiation of electromagnetic waves, thereby to lower the rate of the power supplied by way of capacitive coupling, making the energy level of electrons higher. Besides, when the gap between the high-frequency ring electrode and the ground ring electrode becomes narrow, the high-frequency electric field becomes higher. This increases the rate of radiation of the electromagnetic waves, thereby similarly making the energy level of the electrons higher. By setting the thickness of the quartz plate or the gap between the high-frequency ring electrode and the ground ring electrode opposite to that described above, the energy level of electrons can be close to that due only to the capacitive coupled discharge.

When a high-frequency power (2 MHz) of 500 W is supplied from the bias power supply 56, a voltage of 700 Vpp is generated, to accelerate ions from the plasma, thereby allowing the ions to be incident on the substrate. On the surface of the substrate, the etching gas (carbon fluoride based gas) decomposed by the plasma reacts with the silicon oxide film and the silicon film with the assist of the ions, so that etching proceeds.

When the energy level of electrons is high, decomposition of the carbon fluoride based gas proceeds, to increase the amount of fluorine based radical species, thereby improving the etching rate of the silicon film. Further, under the condition in which decomposition of the gas proceeds, the etched shape in cross-section is substantially perpendicular to the surface of the substrate. Beside, under a condition in which the decomposition of the gas does not proceed, the etched shape tends be normal-tapered. In the manufacture of a semiconductor device, it is required to reduce the etching rate of a silicon film to an etching rate of a silicon oxide film as much as possible for making the etched shape in cross-section perpendicular to the surface of the substrate. To meet such a requirement, it is necessary to suitably control the decomposition state of a carbon fluoride based gas, and to make both the etching rates compatible with each other.

According to the present invention, as described above, by adjusting the thickness of the quartz plate or the gap between the high-frequency ring electrode and the grounded ring electrode, it is possible to control the decomposition state of the carbon fluoride based gas and hence to optimize the etching characteristics.

Further, by changing the dimensions of the high-frequency applying ring electrodes 53a and 53b and the grounded ring electrode 53c, it is possible to change the plasma distribution.

Next, another method of controlling the energy of electrons in this embodiment will be described.

As described above, the high-frequency electric field E is formed between each of the high-frequency ring electrodes 53a and 53b and the grounded ring electrode 53c, and electromagnetic waves are radiated through the high-frequency electric field E. In this case, since no magnetic field is applied in the above example, the electromagnetic waves cannot proceed in the plasma and can only supply the energy to electrons in the vicinity of the quartz plate. In this control method, a current is applied to a coil 58, to form a magnetic field B, thereby allowing electromagnetic waves to proceed in the plasma. Further, the magnetic field intensity is set to be variable with respect to the frequency of the electromagnetic waves in a range including a value at which electron cyclotron resonance occurs. Thus, by controlling radiation of the electromagnetic waves to the plasma due to capacitive coupled discharge and the magnetic field intensity, it is possible to control the energy level given to electrons and hence to suitably control the energy state of electrons.

In the case where a magnetic field is formed, electromagnetic waves can proceed in the plasma even at a frequency of 100 MHz; however, in this case, the magnetic field must be substantially perpendicular to the electric field of the electromagnetic waves. Accordingly, acceleration of electrons due to the high-frequency electric field is restricted by the magnetic field, so that the energy given from the high-frequency electric field to electrons is small, that is, the energy state of electrons can be only slightly increased. Therefore, this technique is effective to increase electrons of a low energy for generation of radical species.

When the magnetic field intensity is set at a value at which electron cyclotron resonance at 100 MHz, that is, at a value of 30 to 40 G, the energy can be effectively supplied to electrons in the plasma from the high-frequency electric field of the electromagnetic waves. As a result, it is possible to enhance the energy level up to the ionization level or more, and hence to promote decomposition of the etching gas.

In this way, by changing the magnetic field intensity, the energy of electrons can be controlled in a wide range from the level suitable for generation of radical species to the ionization level or more, so that decomposition of an etching gas can be adjusted by controlling the magnetic field intensity, to thereby optimize the etching characteristics.

An eighth embodiment will be described with reference to FIG. 12.

Figure 12:
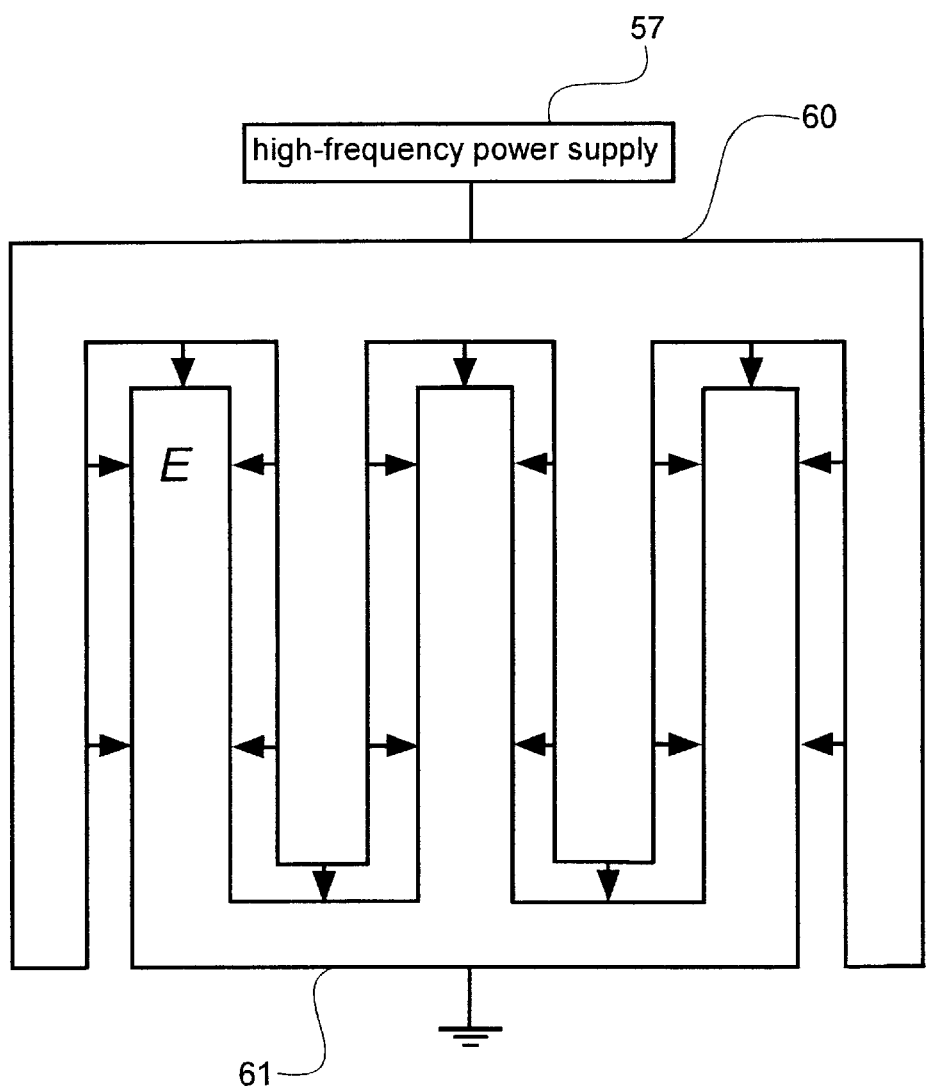
FIG. 12 is a diagram showing the configuration of a plasma processing chamber representing an eighth embodiment of the present invention.

In this embodiment, the high-frequency applying ring electrodes 53a and 53b and the grounded ring electrode 53c, which constitute the upper electrode 53 shown in FIG. 11(a), are modified as shown in FIG. 12.

As shown in FIG. 12. the upper electrode is composed of a high-frequency applying plate electrode 60 and a grounded plate electrode 61. A high-frequency electric field is generated between a comb portion of the high-frequency applying plate electrode 60 and a comb portion of the grounded plate electrode 61, and electromagnetic waves are radiated on the basis of the same principle as described in the first embodiment. Further, the manner of supplying power from the high-frequency applying plate to plasma by capacitive coupling is also the same as described in the first embodiment.

The operation and the function of controlling the energy of electrons are the same as those in the first embodiment excluding the above point, and therefore, explanation thereof is omitted.

Figure 13:
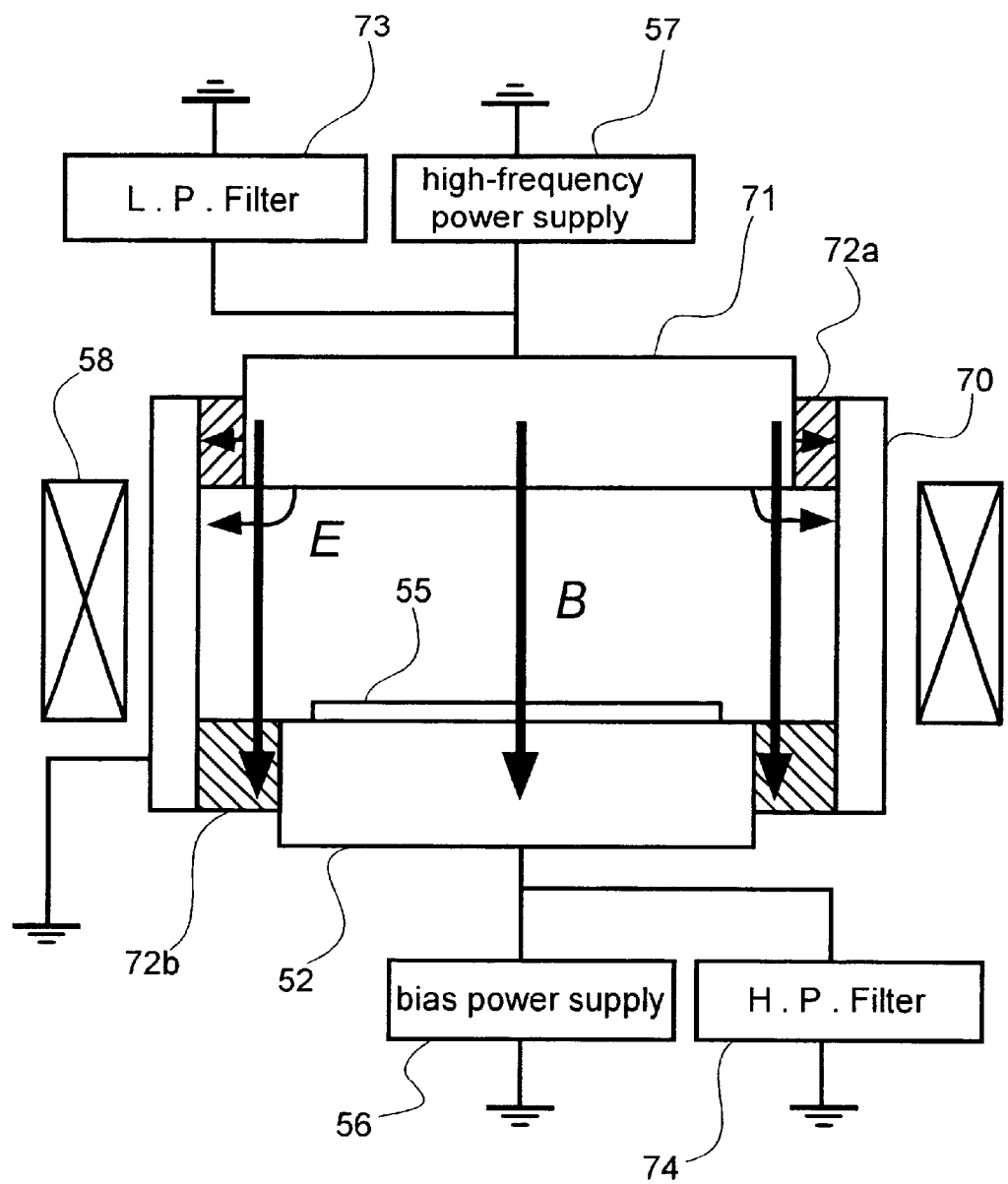
FIG. 13 is a diagrammatic view showing the configuration of a plasma processing chamber representing a ninth embodiment of the present invention.

A ninth embodiment will be described with reference to FIG. 13.

A stage electrode 52 and an upper electrode 71 are disposed in a processing chamber 70 in such a manner as to be opposed to each other. The processing chamber 70 is insulated from the electrodes by means of insulators 72a and 72b. Joints between the processing chamber 70 and the electrodes are vacuum-sealed so that the interior of the processing chamber 70 can be evacuated to a vacuum. The upper electrode 71 is connected to a high-frequency power supply (100 MHz) 57 and is also connected to a low pass filter 73.

The processing chamber 70 is grounded, and a coil 58 is provided around the outer periphery of the processing chamber 70 to form a magnetic field in the processing chamber 70. The processing chamber 70 is also provided with a processing gas supply mechanism, so that the pressure in the processing chamber 70 can be controlled to a specific value by an evacuation control mechanism (not shown) while the processing gas is supplied into the processing chamber 70.

The stage electrode 52 has a structure allowing a substrate 55 to be processed to be mounted thereon. The temperature of the substrate 55 during plasma processing can be controlled by a temperature control mechanism (not shown). The stage electrode 52 is connected to a bias power supply (2 MHz) 56 for controlling the energy of ions to be incident on the substrate 55 and is also connected to a high pass filter 74.

Next, an operational example in which etching is performed using the apparatus of this embodiment will be described.

The substrate 55 to be processed is carried into the processing chamber 70 and mounted on the stage electrode 52. An etching gas (carbon fluoride based gas) at a specific flow rate is supplied from an etching gas source (not shown) into the processing chamber 70, and the interior of the processing chamber 70 is evacuated such that the pressure in the processing chamber 70 becomes 1 Pa. A silicon oxide film as an insulating film and a silicon film for a semiconductor device are formed on the substrate 55. The substrate 55 is electrostatically chucked on the stage electrode 52, and He gas is supplied from a helium gas source (not shown) between the substrate 55 and the stage electrode 52 for preventing a temperature rise of the substrate 55 during etching.

A high-frequency power (100 MHz) of 1.5 KW is supplied to the upper electrode 71 to generate a plasma by discharge. A sheath is formed between the upper electrode 71 and the plasma, and energy is supplied to the plasma by capacitive coupling. In this case, since the electric field formed at an interface between the sheath and the plasma is small, the energy distribution of electrons is close to the Maxwell-Boltzmann distribution.

A high-frequency electric field E is generated between the upper electrode 71 and the processing chamber 70 to radiate electromagnetic waves.

A current is allowed to flow in the coil 58 to form a magnetic field B. The intensity of the magnetic field can be set to be variable with respect to a frequency of the electromagnetic waves in a range including the value at which electron cyclotron resonance occurs.

In the case where a magnetic field is formed, the electromagnetic waves can proceed in the plasma even at a frequency of 100 MHz; however, in this case, the magnetic field must be substantially perpendicular to the electric field of the electromagnetic waves. Accordingly, acceleration of electrons due to the high-frequency electric field is restricted by the magnetic field, so that the energy given from the high-frequency electric field to the electrons is small, that is, the energy state of the electrons can be only slightly increased. Therefore, this is effective to increase electrons of a low energy for generation of radical species.

When the magnetic field intensity is set at a value at which electron cyclotron resonance occurs at 100 MHz, that is, at a value of 30 to 40 G, energy can be effectively supplied to electrons in the plasma from the high-frequency electric field of the electromagnetic waves. As a result, it is possible to enhance the energy level up to the ionization level or more, and hence to promote decomposition of the etching gas.

When high-frequency power (2 MHz) of 500 W is supplied from the bias power supply 56, a voltage of 700 Vpp is generated, to accelerate ions from the plasma, thereby allowing the ions to be incident on the substrate. On the surface of the substrate, the etching gas (carbon fluoride based gas) decomposed by the plasma reacts with the silicon oxide film and the silicon film with the assist of the ions, so that etching proceeds.

When the energy level of the electrons is high, decomposition of the carbon fluoride based gas proceeds, to increase the amount of fluorine based radical species, thereby improving the etching rate of the silicon film. Further, under the condition in which decomposition of the gas proceeds, the etched shape in cross-section is substantially perpendicular to the surface of the substrate. Beside, under the condition in which the decomposition of the gas does not proceed, the etched shape tends be normal-tapered. In the manufacture of a semiconductor device, it is required to reduce the etching rate of silicon film to an etching rate of a silicon oxide film as much as possible for making the etched shape in cross-section perpendicular to the surface of the substrate. To meet such a requirement, it is necessary to suitably control the decomposition state of the carbon fluoride based gas, and to make both the etching rates compatible with each other.

According to the present invention, by changing the intensity of the magnetic field, the decomposition state of the carbon fluoride based gas can be controlled, so that the etching characteristics, such as a ratio between etching rates of the silicon oxide film and the silicon film and the etched shape, can be optimized independently from the pressure, flow rate of the etching gas and the high-frequency power.

Figure 14:
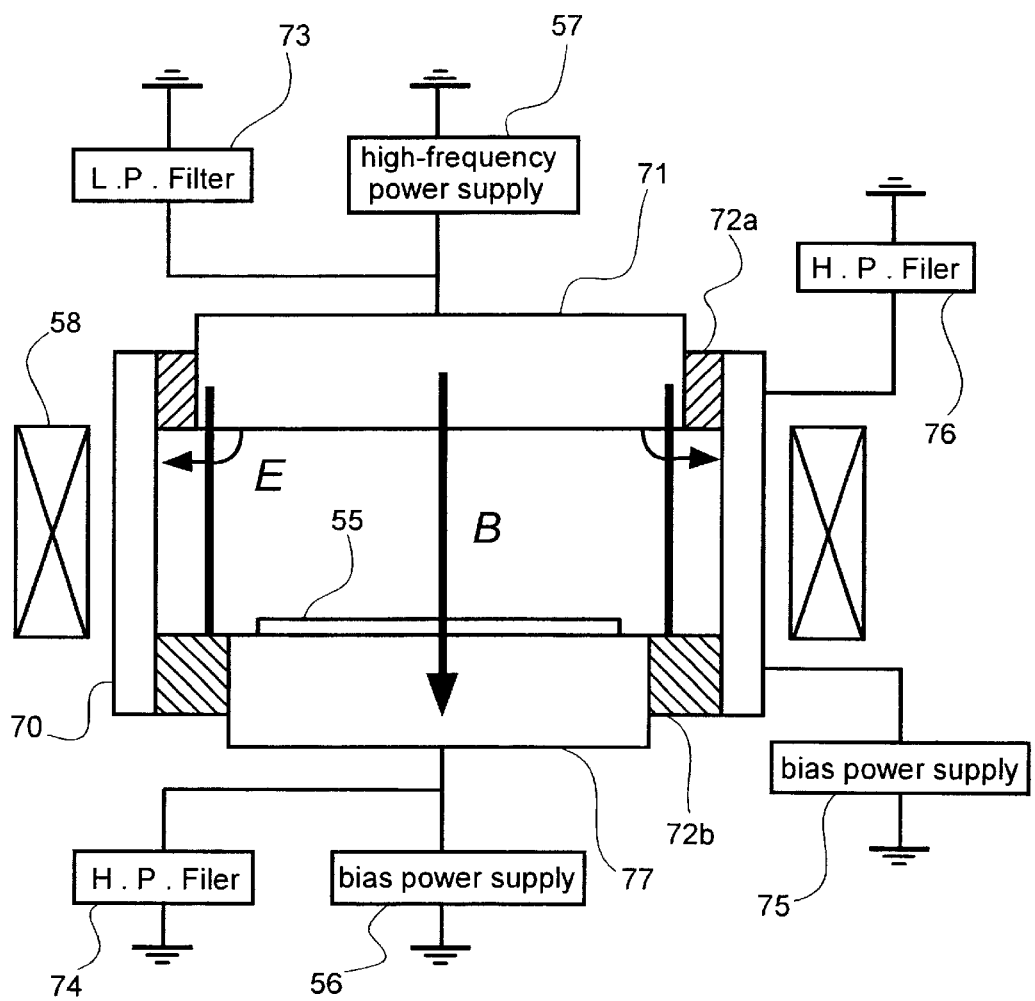
FIG. 14 is a diagrammatic view showing the configuration of a plasma processing chamber representing a tenth embodiment of the present invention.

A tenth embodiment will be described with reference to FIG. 14.

The basic configuration of this embodiment is the same as the embodiment shown in FIG. 13, and therefore, only the differences therebetween will be described below.

The processing chamber 70 is not grounded in this embodiment, but is connected to a bias power supply (800 KHz) 75 and a high pass filter (100 MHz) 76.

A substrate heating mechanism (not shown) is incorporated in a stage electrode 77 for heating a substrate to be processed to a specific value between room temperature and 500° C.

An operational example in which plasma CVD is performed using the apparatus in this embodiment will be described.

A substrate 55 to be processed is carried into the processing chamber 70 and mounted on the stage electrode 77. A CVD gas (silicon fluoride gas+oxygen gas) at a specific flow rate is supplied from a CVD gas source (not shown) into the processing chamber 70. The interior of the processing chamber 70 is evacuated such that the pressure in the processing chamber 70 becomes 4 Pa. The substrate 55 is mounted on the stage electrode 77 and is heated at 300° C. A high-frequency power (100 MHz) of 1.5 RW is supplied to an upper electrode 71, to generate a capacitive coupled discharge between the upper electrode 71 and the stage electrode 77, thereby forming a plasma of the CVD gas.

The upper electrode 71 generates a high voltage (1400 Vpp) at 100 MHz by supply of power from a high-frequency power supply 57, to generate a high-frequency electric field between the upper electrode 71 and the processing chamber 70. While the processing chamber 70 is not grounded, it is substantially in a state of being grounded for the high-frequency of 100 MHz by the high pass filter 76, to radiate electromagnetic waves with a high frequency like the embodiment shown in FIG. 13.

The silicon fluoride gas, which has a strong bonding force, is not easily decomposed, and thereby fluorine is stored in the silicon oxide film in a larger amount. In this embodiment, like the embodiment shown in FIG. 13, the energy level of electrons is controlled by the function of the combination of the electromagnetic waves of 100 MHz and the magnetic field, to promote decomposition of the silicon fluoride gas, followed by exhausting of the dissociated fluorine gas. As a result, it is possible to reduce the amount of fluorine stored in the silicon oxide film and hence to improve the film quality. Further, since decomposition of the silicon fluoride gas is promoted, the reaction between the dissociated silicon and the oxygen gas is also promoted, to thereby improve the film formation rate.

In this embodiment, the frequency characteristic of each the high pass filters 74 and 76 is set at 200 MHz, which is twice the frequency of the applied high-frequency, and accordingly the applied frequency becomes a mixed frequency of 100 MHz and 200 MHz due to the non-linear characteristic of the plasma sheath, to thereby create the resonance condition at the magnetic field intensity of about 70 G. The mixing ratio between the frequencies of 100 MHz and 200 MHZ can be realized by changing the ratio between the reactance and the capacitance of the matching device.

In plasma CVD, there occurs a problem in terms of manufacture of semiconductor devices due to the fact that the silicon oxide film formed on an inner wall of the processing chamber tends to peel to produce particles. In this embodiment, a high-frequency voltage of 800 KHZ can be applied to the inner wall surface of the processing chamber 70 by the bias power supply 75 to increase the energy of incident ions, and also the silicon oxide film formed on the inner wall surface of the processing chamber 70 is removed by etching by fluorine generated by decomposition of the silicon fluoride gas, and consequently, no film adheres on the inner wall surface of the processing chamber during film formation, thus reducing the occurrence of particles.

Figure 15:
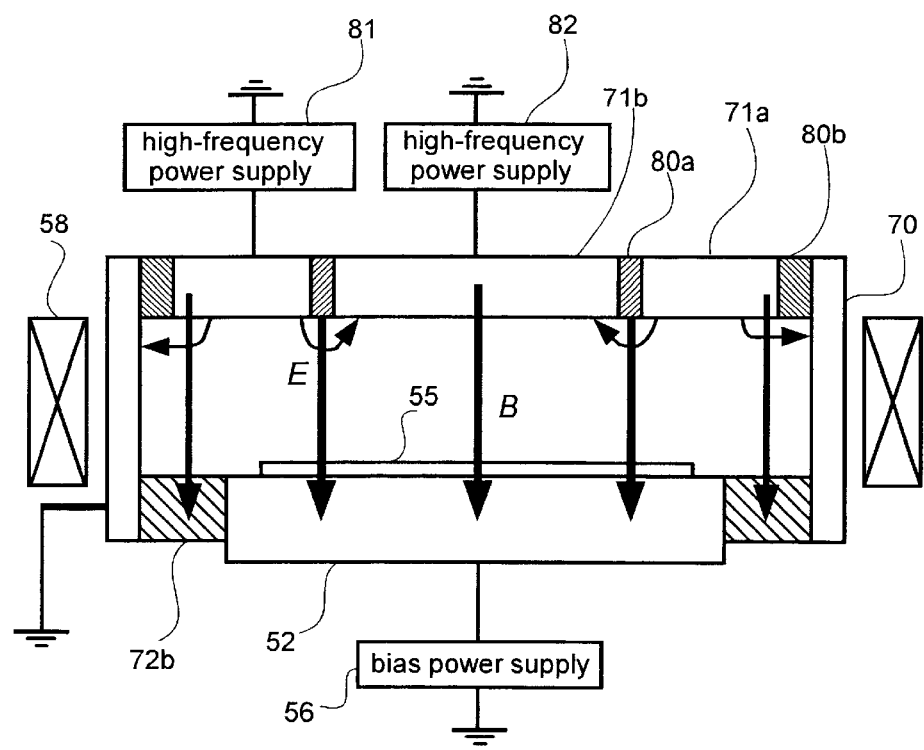
FIG. 15 is diagrammatic a view showing the configuration of a plasma processing chamber representing an eleventh embodiment of the present invention.

An eleventh embodiment will be described with reference to FIG. 15.

The basic configuration of this embodiment is the same as that of the embodiment shown in FIG. 13, and therefore, only the difference therebetween will be described.

An upper electrode 71 is composed of upper electrodes 71a and 71b, which are insulated from each other by an insulator 80a, and is also insulated from the processing chamber 70 by an insulator 80b. The upper electrodes 71a and 71b are connected to high-frequency power supplies 81 and 82, respectively. The high-frequency power supplies 81 and 82 generate frequencies (100 MHz) different in phase and supply the frequencies to the upper electrodes 71a and 71b, respectively.

When radio-frequencies different in phase are supplied to the upper electrodes 71a and 71b, a high-frequency electric field is generated between the upper electrodes 71a and 71b. In the case where the phases of the frequencies generated by the high-frequency power supplies 81 and 82 are shifted 180 from each other, a high-frequency electric field can be most efficiently generated. Besides, in the case where the shift between the phases is 0°, the high-frequency electric field becomes weakest. Thus, by controlling the phases of frequencies and the powers of the high-frequency power supplies 81 and 82, it is possible to control the ratio between the power of electromagnetic waves of a high-frequency generated between the upper electrode 71a and 71b and the power of electromagnetic waves of a high-frequency generated between the upper electrode 71b and the processing chamber 70, and hence to control the uniformity of etching or plasma CVD. Further, by controlling the output power of the high-frequency power supplies 81 and 82, it is possible to control the ratio between powers supplied by capacitive coupling and hence to control the uniformity of etching or plasma CVD.

While two high-frequency power supplies are used in this embodiment, the same effect can be obtained using one power supply by performing phase shifting through capacitances or reactances provided in power lines connecting the power supply to the upper electrodes 71a and 71b.

Figure 16:
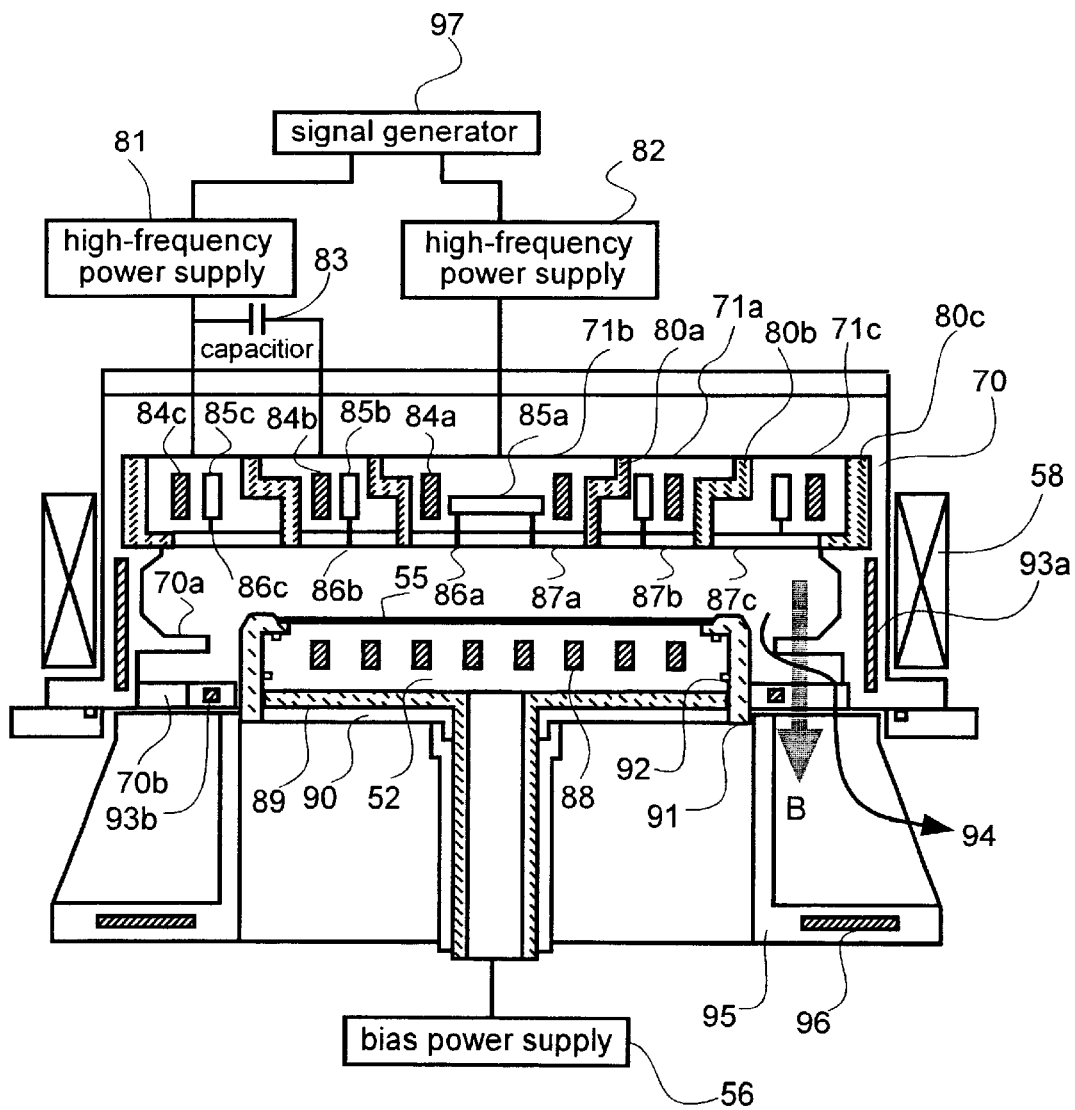
FIG. 16 is a diagrammatic view showing the configuration of a plasma processing chamber representing a twelfth embodiment of the present invention.
Figure 17:
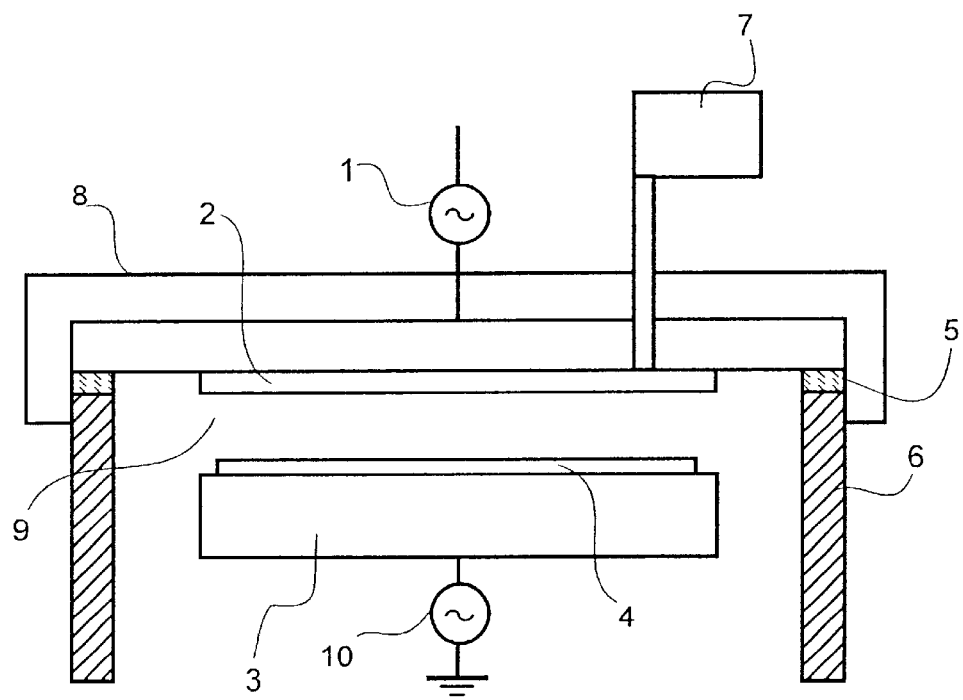
FIG. 17 is a side view showing the configuration of a prior art plasma processing apparatus.

A twelfth embodiment will be described with reference to FIG. 16.

A stage electrode 52 and an upper electrode 71 are disposed in a processing chamber 70 in such a manner as to be opposed to each other. The interior of the processing chamber 70 is evacuated to a vacuum by an evacuating mechanism (not shown), and an etching gas at a specific flow rate is supplied from an etching gas supply mechanism (not shown) into the processing chamber 70. The pressure in the processing chamber is kept at a specific value.

The upper electrode 71 is divided into upper electrodes 71a, 71b and 71c. These electrodes 71a, 71b and 71c are insulated from each other by means of quartz insulators 80a and 80b, and they are also insulated from the processing chamber 70 by means of an insulator 80c. The upper electrode 71b is connected to a high-frequency power supply 82; the upper electrode 71c is connected to a high-frequency power supply 81; and the upper electrode 71a is connected to the high-frequency power supply 81 through a capacitor 83. Each of the high-frequency power supplies 81 and 82 is configured to amplify a signal supplied from a signal generator 97. The signal generator 97 is configured to control the phase and the amplitude of a high-frequency signal to be supplied to each power supply. The frequency of a signal is set at 100 MHz in this embodiment. The upper electrodes 71a, 71b and 71c are grounded through low pass filters (not shown), and a high-frequency current of a frequency of 10 MHz from a bias power supply 56 is allowed to flow through each of the upper electrodes.

The upper electrode 71 is provided with coolant flow passages 84a, 84b and 84c connected to a circulator (not shown). A coolant whose temperature is controlled at 15° C. is circulated in the flow passages 84a, 84b and 84c.

The upper electrode 71 is provided with etching gas supply passages 85a, 85b and 85c to which an etching gas is supplied from an etching gas source (not shown). The etching gas is injected from gas supply ports 86a, 86b and 86c.

The upper electrode 71 is fixed with cover plates 87a, 87b and 87c. The cover plate 87a is formed of a silicon single crystal plate and has a gas supply port 86aa at a position corresponding to that of the gas supply port 86a. The size of the gas supply port 67aa is set to be ¼ to ¹⁄₁₀ of the size of the gas supply port 86a. The cover plate 87b is formed of a silicon single crystal plate and has a gas supply port 86bb at a position corresponding to that of the gas supply port 86b. The size of the gas supply port 86bb is set to be ¼ to ¹⁄₁₀ of the size of the gas supply port 86b. The cover plate 87c is made from SiC.

The processing chamber 70 is provided with flow passages 93a and 93b through which a coolant whose temperature is controlled at 50° C. is circulated for controlling the temperature of an inner wall surface of the processing chamber to a value in a range of ±5° C.

The processing chamber 70 is integrated with confinement plates 70a and 70b. An exhaust passage 94 is provided such that a central portion thereof extends at an angle perpendicular to the magnetic field B formed by a coil 58. At portions where the confinement plates 70a and 70b are provided, a plasma is diffused in such a manner to cross the magnetic field B, and therefore, the plasma is not extended, that is, confined.

A high-frequency power at 10 MHz is supplied from a bias power supply 56 to the stage electrode 52. The stage electrode 52 is provided with an insulator 89 and a grounded shield 90 for preventing occurrence of abnormal discharge.

The stage electrode 52 is provided with a flow passage 88 through which a coolant at −10° C. is circulated by a circulator (not shown). An electrostatic chuck mechanism (not shown) is provided on a surface of the stage electrode 52 on which a substrate 55 to be processes is placed. Helium gas at a controlled pressure of 3 KPa is supplied from a helium gas source (not shown) between the substrate and the electrostatic chuck mechanism for controlling the temperature of the substrate 55 in a range of 50° C. to 100° C. during etching.

A quartz made cover 91 is provided around the stage electrode 52, The thickness of the cover 91 is adjusted to such a level as to allow the intensity of an electric field at a high-frequency of 10 MHz for accelerating ions to remove a deposition film adhering on the surface of the quartz, but to effect little etching of the cover 91. A seal mechanism 92 is provided between the cover 91 and the stage electrode 52 for supplying helium gas between the substrate 55 and the electrostatic chuck mechanism. With this configuration, the cover 91 is cooled by the stage electrode 52 such that the temperature thereof is controlled in a range of −10° C. to +10° C. during etching.

A deposition plate 95 is provided on the downstream side of the exhaust passage, and a coolant at 25° C. is circulated in a flow passage 96 formed in the deposition plate 95. A fin is provided on the deposition plate 95 in the direction of not increasing exhaust resistance, to extend a surface area in contact with an exhaust gas.

An operational example in which etching is performed using the apparatus of this embodiment will be described.

In this embodiment, an oxide film is etched.

A mixture of argon and C4F8 is supplied from an etching gas source (not shown) into the processing chamber 70, and the interior of the processing chamber 70 is exhausted so that the pressure in the processing chamber 70 becomes 2 Pa. The etching gas is supplied from the gas supply ports 86a, 86aa, 86b and 86bb. At this time, the respective spaces between the cover plates 87a, 87b and 87c and the upper electrodes 71b, 71a and 71c are filled with the etching gas at 3 KPa, so that the cover plates 87a, 87b and 87c are cooled at a temperature in a range of 15° C. to 50° C. by the upper electrode 71 whose temperature is controlled.

A high-frequency signal of 100 MHz is generated by the signal generator 97, and high-frequency power is supplied to the upper electrode 71 from the high-frequency power supplies 81 and 82, to generate capacitive coupled discharge between the upper electrode 71 and the stage electrode 52.

A high-frequency voltage whose phase is shifted 90° by the capacitor 83 is supplied between the upper electrodes 71a and 71c. The phase of a high-frequency voltage supplied between the upper electrodes 71b and 71a can be freely set in a range of 0° to 180° by control of the phase of the high-frequency signal by the signal generator 97. Accordingly, the high-frequency voltage generated through the insulator 80a can be set to be smaller or larger than the high-frequency voltage generated through the insulator 80b by control of the phase of the high-frequency signal supplied by the signal generator 97. Thus, the power of electromagnetic waves radiated through the insulator 80a can be set to be smaller or larger than the power radiated through the insulator 80b.

Power is supplied from an AC power supply (not shown) to the coil 56 to generate a magnetic field in a range of 30 to 40 G. At this time, electrons in the plasma are accelerated by electron cyclotron resonance with electromagnetic waves at 100 MHz radiated from the magnetic field, so that the temperature of electrons is increased and the plasma density is increased to a value of $1 \times 10^{11}$ cm$^{-3}$ or more. The distribution of the plasma density can be controlled by controlling the radiated electromagnetic waves based on adjustment of the phase of the high-frequency voltage supplied to the upper electrode 71. Further, the distribution of the plasma density due to capacitive coupled plasma can be controlled by controlling the outputs of the high-frequency power supplies 81 and 82, to thus control the temperature distribution of electrons in co-operation with control of the rate of the radiated electromagnetic waves.

In this embodiment, with respect to the power for capacitive coupled discharge, the rate thereof supplied to the outer peripheral portion is made higher, and with respect to the power for discharge due to radiation of electromagnetic waves, the rate thereof supplied to the central portion is made higher. Accordingly, the temperature of electrons at the central portion is higher and the temperature of electrons at the outer peripheral portion is lower, to suppress the occurrence of fluorine radicals at the outer peripheral portion at which decomposition of the etching gas proceeds, resulting in uniform processing. In the case of processing a large-diameter substrate, with respect to a deposition film adhering on the surface of the substrate, the thickness at the central portion is larger than that at the peripheral portion. As a result, the etching shape at the central portion has a larger taper angle on the side of the etching pattern, to cause a difference in etching shape between the central portion and the peripheral portion. This makes it difficult to accurately form a fine etching shape over the entire surface of the large-diameter substrate. In such a case, according to the present invention, by increasing the radiation of electromagnetic waves at the central portion to control the plasma density distribution into a slight projecting shape, the ion current at the central portion is increased. This makes it possible to control the taper angle of the etching shape, and hence to realize highly accurate etching over the entire surface of the large-diameter substrate. Further, such processing can be suitably set individually for processes different in etching condition (for example, etching for a contact hole or through-hole) without any adjustment of the hardware configuration, because the phase of the signal generated by the signal generator 97 can be set in accordance with the configuration of the etching apparatus.

With respect to the etching capability, since a high density plasma can be generated at a low pressure of 2 Pa, a vertical contact-hole can be formed at an etching rate of 900 nm/min, thus establishing a compatibility between a fine-processing capability and the productivity. With respect to selectivity, since decomposition of the etching gas can be controlled by adjustment of the temperature of the electrons, the process condition in which the fine-processing capability is compatible with the selectivity can be enlarged.

During etching, the temperatures of the surfaces of the cover plates 87a, 87b and 87c of the upper electrode 71 can be controlled, and ions in the plasma are accelerating incident on the surfaces of the cover plates 87a, 87b and 87c by the applied high-frequency voltage at 100 MHz, so that no deposition film is allowed to be formed on the surfaces of the cover plates 87a, 87b and 87c. And, at the surfaces of the cover plates 87a and 87b, silicon is slightly etched; and at the cover plate 87c, SiC is slightly etched. In other words, the cover plates 87a, 87b and 87c are in a state in which new surfaces are usually exposed, and consequently the reaction and gas discharge on these surfaces can be kept constant.

Similarly, with respect to the cover 91 for the stage electrode 52, the surface of the quartz is slightly etched by incidence of accelerated ions due to application of the bias power and by temperature control, so that the reaction and gas discharge on the surface of the cover 91 can be kept constant.

Since the inner wall surface of the processing chamber 70 is grounded, incident ions are little accelerated, and thereby a composite film of C and F is formed on the inner wall surface. Thus, a new film is usually formed on the surface and thereby the surface is kept constant. Further, since the surface temperature is kept at 50° C., gas release does not occur from the deposition film. As a result, the surface state and the gas release can be kept constant.

The change in etching characteristics due to repeated etching can be thus prevented, and further, since no deposition film is formed on the upper electrode 71 and the stage electrode 52, surface deterioration does not occur, with a result that little dust is produced. Since the temperature of the surface of the processing chamber 70 on which a deposition film adheres is kept constant as described above, no expansion force is generated between the deposition film and the inner wall surface of the processing chamber, and thereby there is no peeling of the film. This is effective to significantly reduce the occurrence of dust in co-operation with the above measure for the upper electrode and the stage electrode.

While in the above embodiments the operational examples in which the present invention is applied to etching and plasma CVD are described, the present invention is not limited thereto, and it is to be understood that the present invention can be applied to various other processes using plasma such as plasma polymerization and plasma sputtering.

With respect to the frequency of a high-frequency power supply for generating plasma, in the above embodiments, examples have been described using a frequency of 68 MHz and 100 MHz, that is, using a condition in which the radiation effect of electromagnetic waves is high; however, the same effect can be obtained using a frequency lower than 100 MHz provided that the high-frequency voltage is set to a high value. The frequency is not particularly limited; however, the result of experiments shows that the frequency may be set at 10 MHz or more for obtaining a desirable effect. Although a frequency larger than the above value can be theoretically used, such a frequency has practical inconveniences at present in that a power supply for generating such a frequency is difficult to provide; a waveguide is required in the apparatus; and since the voltage for capacitive coupled discharge is low, the power for radiation of electromagnetic waves cannot be enhanced. For these reasons, an example using such a high frequency is not described in the above embodiments.

In the above embodiments, there are described examples using the magnetic field intensity near the critical value at which electron cyclotron resonance occurs, however the result of experiments shows that an effect of increasing the plasma density can be obtained even under a condition in which the magnetic field intensity is set at about ⅓ of the value at which electron cyclotron resonance occurs. The plasma density is increased in proportion to the magnetic field intensity until the magnetic field intensity reaches the value at which electron cyclotron resonance occurs. If the magnetic field intensity is increased beyond the above critical value, the plasma density is rather reduced. For example, when the magnetic field intensity is increased to be two or three times the above critical value, the plasma density is reduced to a level equivalent to that under the condition in which no magnetic field is applied, although it depends on the process conditions. Accordingly, although the magnetic field intensity is not particularly limited to the critical value at which electron cyclotron resonance occurs, it may be set to a value near the critical value for obtaining the desired effect. Such a phenomenon means that the supply of energy to the plasma from the electromagnetic waves can be controlled by the magnetic field intensity, that is, the energy of electrons can be controlled by the magnetic field.

With respect to the plasma generating method, in the above embodiments, there are described examples using the combination of capacitive coupled discharge and radiation of electromagnetic waves as a means for controlling the energy state of electrons. However, it is apparent that radiation of electromagnetic waves generated by applying a high-frequency voltage between insulated conductive members can generate a plasma by itself. That is, such a method of generating electromagnetic waves may be regarded as a technique for generating plasma. However, in accordance with such a method, since the high-frequency voltage is reduced due to components being capacitive-coupled with plasma, it is required to make the capacitance formed between the electrode and the plasma as small as possible.

Although the temperature of the processing chamber 70 is controlled at 50° C. in the above embodiments, the present invention is not limited thereto. When the temperature of an inner wall surface of the processing chamber is more than 200° C., a deposition film is not formed on the surface, that is, a new deposition surface is not usually formed. Further, since decomposition of the adhesive film is rapidly increased at a temperature of 200° C. or more, the temperature of the processing chamber 70 is required to be set to a value of 200° C. or less. From the practical viewpoint, the temperature of the processing chamber 70 may be set in a range of 10° C. to 80° C. including an environmental temperature at which the apparatus is used.

What is claimed is:

1. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said plasma processing chamber;

means for processing a substrate to be processed in said plasma processing chamber by exposing said substrate to the plasma which is generated by said plasma generating means;

wherein said plasma generating means includes at least one first conductive component having a high-frequency electric power applied thereto and at least one second conductive component without the high-frequency electric power being applied thereto, means for insulating said at least one first conductive component with respect to the at least one second conductive component so as to enable generation of a high-frequency electric field between said at least one first conductive component and said at least one second conductive component and for radiating electromagnetic waves according to said high-frequency electric field into said plasma processing chamber;

wherein said at least one second conductive component is a grounded conductive component; and wherein said at least one first conductive component includes at least two concentric ring-shaped members having said high-frequency electric power applied thereto and said at least one second conductive component includes at least one concentric ring-shaped member which is grounded and disposed between said at least two first conductive components.

2. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said plasma processing chamber;

means for processing a substrate to be processed in said plasma processing chamber by exposing said substrate to the plasma which is generated by said plasma generating means;

wherein said plasma generating means includes at least one first conductive component having a high-frequency electric power applied thereto and at least one second conductive component without the high-frequency electric power being applied thereto, means for insulating said at least one first conductive component with respect to the at least one second conductive component so as to enable generation of a high-frequency electric field between said at least one first conductive component and said at least one second conductive component and for radiating electromagnetic waves according to said high-frequency electric field into said plasma processing chamber;

wherein said at least one second conductive component is a grounded conductive component; and wherein said at least one first conductive component is a first comb-shaped member and said at least one second conductive component which is grounded is a second comb-shaped member disposed with respect to said first comb-shaped member.

3. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said plasma processing chamber;

means for processing a substrate to be processed in said plasma processing chamber by exposing said substrate to the plasma which is generated by said plasma generating means;

wherein said plasma generating means includes at least one first conductive component having a high-frequency electric power applied thereto and at least one second conductive component without the high-frequency electric power being applied thereto, means for insulating said at least one first conductive component with respect to the at least one second conductive component so as to enable generation of a high-frequency electric field between said at least one first conductive component and said at least one second conductive component and for radiating electromagnetic waves according to said high-frequency electric field into said plasma processing chamber; and wherein at least said one first conductive component having said high-frequency electric power applied thereto enables generation of a capacitive coupling to said plasma which is generated in said plasma processing chamber.

4. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said plasma processing chamber;

means for processing a substrate to be processed in said plasma processing chamber by exposing said substrate to the plasma which is generated by said plasma generating means;

wherein said plasma generating means includes at least one first conductive component having a high-freguency electric power applied thereto and at least one second conductive component without the high-freguency electric power being applied thereto, means for insulating said at least one first conductive component with respect to the at least one second conductive component so as to enable generation of a high-freguency electric field between said at least one first conductive component and said at least one second conductive component and for radiating electromagnetic waves according to said high-freguency electric field into said plasma processing chamber; and wherein said at least one first conductive component and said at least one second conductive component are disposed in a planar arrangement.

5. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said processing chamber;

means for processing a substrate to be processed in said plasma processing chamber by exposing said substrate to the plasma which is generated by said plasma generating means;

wherein said plasma generating means includes at least one first conductive component having a first high-frequency electric power supplied thereto, at least one second conductive component having a second high-frequency electric power supplied thereto, means for insulating said at least one first conductive component with respect to said at least one second conductive component, and means for generating a high-frequency electric field between said at least one first conductive component and said at least one second conductive component so as to enable generation of a high-frequency electric field between said at least one first conductive component and for radiating electromagnetic waves according to said high-frequency electric field into said plasma processing chamber; and wherein said at least one first conductive component and said at least one second conductive component are disposed in a planar arrangement.

6. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said processing chamber;

means for processing a substrate to be processed in said plasma Processing chamber by exposing said substrate to the plasma which is generated by said plasma generating means;

wherein said plasma generating means includes at least one first conductive component having a first high-frequency electric power supplied thereto, at least one second conductive component having a second high-frequency electric power supplied thereto, said first high-frequency electric power and said second high-frequency electric power generating frequencies different in phase, means for insulating said at least one first conductive component with respect to said at least one second conductive component, and means for generating a high-frequency electric field between said at least one first conductive component and said at least one second conductive component so as to enable generation of a high-frequency electric field between said at least one first conductive component and said at least one second conductive component and for radiating electromagnetic waves according to said high-frequency electric field into said plasma processing chamber; and wherein said at least one first conductive component and said at least one second conductive component are disposed in a planar arrangement.

7. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said Processing chamber;

means for processing a substrate to be processed in said plasma processing chamber by exposing said substrate to the plasma which is generated by said plasma generating means;

wherein said plasma generating means includes at least one first conductive component having a first high-frequency electric power supplied thereto, at least one second conductive component having high-frequency electric power supplied thereto through a capacitor which is connected to said first high-frequency electric power which is supplied to said at least one first conductive component, means for insulating said at least one first conductive component with respect to said at least one second conductive component, and means for generating a high frequency electric field between said at least one first conductive component and said at least one second conductive component so as to enable generation of a high-frequency electric field at least between said at least one first conductive component and said at least one second conductive component and for radiating electromagnetic waves according to said high-frequency electric field into said plasma processing chamber; and wherein said plasma generating means further includes at least one third conductive component having a second high-frequency electric power supplied thereto, and said means for insulating effecting insulation of said at least third conductive component with respect to said at least one first conductive component and said at least one second conductive component.

8. A plasma processing apparatus for plasma processing of a substrate, comprising:

a plasma processing chamber;

means for supplying a plasma processing gas into said plasma processing chamber;

means for evacuating an interior of said plasma processing chamber;

means for generating a plasma into said processing chamber;

means for processing a substrate to be processed in said plasma processing chamber by exposing said substrate to the plasma which is generated by said plasma generating means;

wherein said plasma generating means includes at least one first conductive component having a first high-frequency electric power supplied thereto, at least one second conductive component having high-frequency electric power supplied thereto through a capacitor which is connected to said first high-frequency electric power which is supplied to said at least one first conductive component, means for insulating said at least one first conductive component with respect to said at least one second conductive component, and means for generating a high frequency electric field between said at least one first conductive component and said at least one second conductive component so as to enable generation of a high-frequency electric field at least between said at least one first conductive component and said at least one second conductive component and for radiating electromagnetic waves according to said high-frequency electric field into said plasma processing chamber; and wherein said at least one first conductive component and said at least one second conductive component are disposed in a planar arrangement.

9. A plasma processing method for plasma processing of a substrate disposed in a plasma processing chamber having a plasma processing gas applied thereto, comprising the steps of:

evacuating an interior of the plasma processing chamber;

generating a plasma into the plasma processing chamber by applying a high-frequency electric power to at least one first conductive component disposed with respect to at least one second conductive component without the high-frequency electric power being applied thereto, the at least one first conductive component being insulated with respect to the at least one second conductive component so as to enable generation of a high-frequency electric field therebetween and enabling radiation of electromagnetic waves according to the high-frequency electric field into the plasma processing chamber; and effecting plasma processing of the substrate by exposing the substrate to the plasma which is generated in the plasma processing chamber;

wherein the at least one first conductive component and the at least one second conductive component are disposed in a planar arrangement.

10. A plasma processing method for plasma processing a substrate disposed in a plasma processing chamber having a processing gas supplied thereto, comprising the steps of:

evacuating an interior of the plasma processing chamber and establishing a predetermined pressure therein;

generating a plasma in the interior of the plasma processing chamber;

establishing a temperature of an inner wall face of said plasma processing chamber sufficient to enable a deposition film having a temperature of 10° C. to 80° C. to be formed thereon;

effecting plasma processing of the substrate in accordance with the generated plasma; and forming the deposition film on the inner wall face of said plasma processing chamber.

11. A plasma processing method according to claim 10, further comprising controlling the temperature of the inner wall face of the plasma processing chamber within a temperature range sufficient to prevent the deposition film from peeling off from the inner wall face.

* * * * *